US012745402B2

(12) United States Patent
Mukhopadhyay et al.

(10) Patent No.: US 12,745,402 B2
(45) Date of Patent: Sep. 22, 2026

(54) NANOSHEET 3D TRANSISTOR FOR ADVANCED MEMORY ELEMENTS

(71) Applicant: Tokyo Electron Limited, Tokyo (JP)

(72) Inventors: Partha Mukhopadhyay, Oviedo, FL (US); Henry Jim Fulford, Albany, NY (US); Mark I. Gardner, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 365 days.

(21) Appl. No.: 18/598,660

(22) Filed: Mar. 7, 2024

(65) Prior Publication Data

US 2025/0098174 A1 Mar. 20, 2025

Related U.S. Application Data

(60) Provisional application No. 63/539,575, filed on Sep. 20, 2023.

(51) Int. Cl.
*H10B 51/30* (2023.01)

(52) U.S. Cl.
CPC .................................... *H10B 51/30* (2023.02)

(58) Field of Classification Search
None
See application file for complete search history.

(56) References Cited

U.S. PATENT DOCUMENTS

| | | | | |
|---|---|---|---|---|
| 11,302,810 | B1 * | 4/2022 | Gong | H10D 30/43 |
| 11,973,141 | B2 * | 4/2024 | Zhang | H10D 30/701 |
| 2022/0406797 | A1 * | 12/2022 | Kim | H10B 51/10 |
| 2023/0269948 | A1 * | 8/2023 | Kao | H10D 64/512 |
| 2023/0337435 | A1 * | 10/2023 | Gardner | H10D 30/43 |
| 2024/0120415 | A1 * | 4/2024 | Clendenning | H10D 30/47 |

* cited by examiner

*Primary Examiner* — Cory W Eskridge
(74) *Attorney, Agent, or Firm* — Foley & Lardner LLP

(57) ABSTRACT

Semiconductor devices and corresponding methods of manufacture are disclosed. The semiconductor device includes a first metal structure extending in a first lateral direction. The semiconductor device includes a first ferroelectric layer surrounding a first portion of the first metal structure. The semiconductor device includes a first channel layer surrounding the first ferroelectric layer. The semiconductor device includes a first gate structure surrounding the first portion of the first metal structure, with the first ferroelectric layer and the first channel layer interposed therebetween. The semiconductor device includes a first gate electrode in electrical contact with the first gate structure. The semiconductor device includes a second gate electrode in electrical contact with a second portion of the first metal structure.

20 Claims, 21 Drawing Sheets

200

200

200

200

200

200

NANOSHEET 3D TRANSISTOR FOR ADVANCED MEMORY ELEMENTS

CROSS-REFERENCE TO RELATED APPLICATIONS

This application claims priority to U.S. Provisional Application No. 63/539,575, filed Sep. 20, 2023, which is incorporated by reference in its entirety.

FIELD OF THE DISCLOSURE

This disclosure relates to microelectronic devices including semiconductor devices, transistors, and integrated circuits, including methods of microfabrication.

BACKGROUND

In the manufacture of semiconductor devices (especially on the microscopic scale), various fabrication processes are executed, for example, film-forming depositions, etch mask creation, patterning, material etching and removal, and doping treatments, among others. These processes can be performed repeatedly to form desired semiconductor device elements on a substrate. Historically, with microfabrication, transistors have been created in one plane, with wiring or metallization formed above the active device plane and have thus been characterized as two-dimensional (2D) circuits or 2D fabrication. Scaling efforts have greatly increased the number of transistors per unit area in 2D circuits, yet scaling efforts are running into greater challenges as scaling enters single digit nanometer semiconductor device fabrication nodes. Semiconductor device fabricators have expressed a desire for three-dimensional (3D) semiconductor circuits in which transistors are stacked on top of each other.

SUMMARY

Three-dimensional integration (e.g., the vertical stacking of multiple devices) aims to overcome scaling limitations experienced in planar devices by increasing transistor density in volume rather than area. Three-dimensional integration as applied to random logic designs is substantially more difficult than alternative approaches. Three-dimensional integration for logic chips (e.g., CPU (central processing unit), GPU (graphics processing unit), FPGA (field programmable gate array, SoC (System on a Chip), etc.) are being pursued. In some aspects, devices may not be fabricated with nanosheet gate-all-around (GAA) ferroelectric conductive oxide junction field-effect transistor (FET) with dual gate. In such cases, these devices may not allow for n-bit memory cells and capacitors to hold electrical charges.

The techniques described herein include methods and devices for 3D fabrication of semiconductor devices. Specifically, the techniques can provide methods and devices for the fabrication of nanosheet 3D transistors for advanced memory elements. For example, the techniques can provide double (e.g., two) gates single horizontal nanosheet transistor for n-bit non-volatile memory cell (e.g., behaves as a 2-bit memory cell) with ferroelectric and conductive oxide channel, thereby creating a horizontal GAA nanosheet structure. One or more capacitors can be added to improve (e.g., lower) power consumption. The device fabricated using the techniques of the technical solution discussed herein can include a memory block element with various different electrical (e.g., current) level states, such as four current level states, including but not limited to no current, medium current, lower current, or high current, for example.

In some configurations, when ferroelectric is programmed, the channel (e.g., channel structure) can convert or change from medium to high current state according to the power at a switch terminal (e.g., $V_{GS}$). For example, when $V_{GS}=0$, the memory block can hold the charge (e.g., electricity or power) permanently. To perform a read or write operation, power can be provided at the switch terminal, e.g., for the memory block to hold the charge temporarily. By adding a capacitor to the device, the capacity can supply the charge, thereby maintaining the charge in the channel resulting in a permanent state (e.g., permanent power ON). The techniques of the technical solution discussed herein can provide a reduced refresh time for the capacitor to improve the power consumption of the device. Further, the techniques discussed herein can allow for an additional number of bits (e.g., n number) by changing the voltage level at the ferroelectric programming to set different current levels at the channel, resulting in additional states (e.g., power states) at output to increase the bit number from 2-bit initial to n-bit, for example. In some cases, by including the capacitor in the device, the capacitor can maintain the charge state at the power switch to a permanent state, increasing the read and write speed of the device.

Of course, the order of discussion of the different steps as described herein has been presented for clarity's sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

At least one aspect of the present disclosure is directed to a semiconductor device. The semiconductor device can include a first metal structure extending in a first lateral direction. The semiconductor device can include a first ferroelectric layer surrounding a first portion of the first metal structure. The semiconductor device can include a first channel layer surrounding the first ferroelectric layer. The semiconductor device can include a first gate structure surrounding the first portion of the first metal structure, with the first ferroelectric layer and the first channel layer interposed therebetween. The semiconductor device can include a first gate electrode in electrical contact with the first gate structure. The semiconductor device can include a second gate electrode in electrical contact with a second portion of the first metal structure.

The second portion of the first metal structure can be extended from the first portion of the first metal structure along the first lateral direction. The first gate electrode and the second gate electrode can both extend in a vertical direction and may be electrically isolated from each other.

The semiconductor device can include a second metal structure extending in the first lateral direction and spaced from the first metal structure in a second lateral direction perpendicular to the first lateral direction. The semiconductor device can include a second ferroelectric layer surrounding a first portion of the second metal structure. The semiconductor device can include a second channel layer surrounding the second ferroelectric layer. The semiconductor device can include a second gate structure surrounding the first portion of the second metal structure, with the second ferroelectric layer and the second channel layer interposed therebetween. The semiconductor device can include a third gate electrode in electrical contact with the second gate structure. The semiconductor device can include a fourth gate electrode in electrical contact with a second portion of the second metal structure. The second portion of the second metal structure may be extended from the first portion of the second metal structure along the first lateral direction.

The first gate structure and the second gate structure can be electrically coupled to each other. The semiconductor device can include a first vertical capacitor in electrical contact with the first gate structure. The semiconductor device can include a second vertical capacitor in electrical contact with the second gate structure. The semiconductor device can include an interconnect structure extending in the second lateral direction to connect the first vertical capacitor to the second vertical capacitor.

The semiconductor device can include a first source/drain electrode extending in a vertical direction to connect to a first end of the first channel layer. The semiconductor device can include a second source/drain electrode extending in the vertical direction to connect to a second end of the first channel layer. At least the first metal structure, the first ferroelectric layer, the first channel layer, and the first gate structure can operatively serve as a ferroelectric field-effect-transistor (FeFET)-based memory cell.

The memory cell may be configured to present four distinct logic states through applying respective voltages on the first gate electrode and the second gate electrode. The first gate structure can include a high-k dielectric material and a metal material.

At least one aspect of the present disclosure is directed to a semiconductor device. The semiconductor device can include a first metal structure extending in a first lateral direction and including a first portion and a second portion connected to each other with a third portion. The semiconductor device can include a first ferroelectric layer surrounding the first portion of the first metal structure. The semiconductor device can include a first channel layer surrounding the first ferroelectric layer. The semiconductor device can include a first gate structure extending in a second lateral direction perpendicular to the first lateral direction and surrounding the first portion of the first metal structure with the first ferroelectric layer and the first channel layer interposed therebetween. The semiconductor device can include a first gate electrode in electrical contact with the first gate structure. The semiconductor device can include a second gate electrode in electrical contact with the second portion of the first metal structure.

The semiconductor device can include second metal structure extending in the first lateral direction and including a first portion and a second portion connected to each other with a third portion. The semiconductor device can include a second ferroelectric layer surrounding the first portion of the second metal structure. The semiconductor device can include a second channel layer surrounding the second ferroelectric layer. The semiconductor device can include a second gate structure extending in the second lateral direction and surrounding the first portion of the second metal structure with the second ferroelectric layer and the second channel layer interposed therebetween. The semiconductor device can include a third gate electrode in electrical contact with the second gate structure. The semiconductor device can include a fourth gate electrode in electrical contact with the second portion of the second metal structure.

The first gate structure and the second gate structure may be electrically coupled to each other. The first channel layer and the second channel layer can each include a semiconductive-behaving material. The first gate electrode and the second gate electrode may both extend in a vertical direction and are electrically isolated from each other.

At least the first metal structure, the first ferroelectric layer, the first channel layer, and the first gate structure can operatively serve as a ferroelectric field-effect-transistor (FeFET)-based memory cell. The memory cell may be configured to present four distinct logic states through applying respective voltages on the first gate electrode and the second gate electrode.

Yet another aspect of the present disclosure is directed to a method for fabricating semiconductor device. The method can include providing a stack including a metal structure extending in a first lateral direction. The method can include separating the metal structure into a first portion and a second portion. The method can include connecting the first portion and the second portion with a third portion. The method can include sequentially surrounding the first portion with a ferroelectric layer, a semiconductive-behaving layer, and a gate structure that extends in a second lateral direction. The method can include forming a first gate electrode and a second gate electrode to contact the first portion and the second portion, respectively.

The first gate electrode and the second gate electrode can both extend in a vertical direction and are electrically isolated from each other. The method can include forming a first source/drain electrode extending in a vertical direction to connect to a first end of the semiconductive-behaving layer. The method can include forming a second source/drain electrode extending in the vertical direction to connect to a second end of the semiconductive-behaving layer These and other aspects and implementations are discussed in detail below. The foregoing information and the following detailed description include illustrative examples of various aspects and implementations, and provide an overview or framework for understanding the nature and character of the claimed aspects and implementations. The drawings provide illustrations and a further understanding of the various aspects and implementations, and are incorporated in and constitute a part of this specification. Aspects can be combined, and it will be readily appreciated that features described in the context of one aspect of the invention can be combined with other aspects. Aspects can be implemented in any convenient form. As used in the specification and in the claims, the singular form of "a," "an," and "the" include plural referents unless the context clearly dictates otherwise.

BRIEF DESCRIPTION OF THE DRAWINGS

Non-limiting embodiments of the present disclosure are described by way of example with reference to the accompanying figures, which are schematic and are not intended to be drawn to scale. Unless indicated as representing the background art, the figures represent aspects of the disclosure. For purposes of clarity, not every component may be labeled in every drawing. In the drawings.

DETAILED DESCRIPTION

Figure 1:
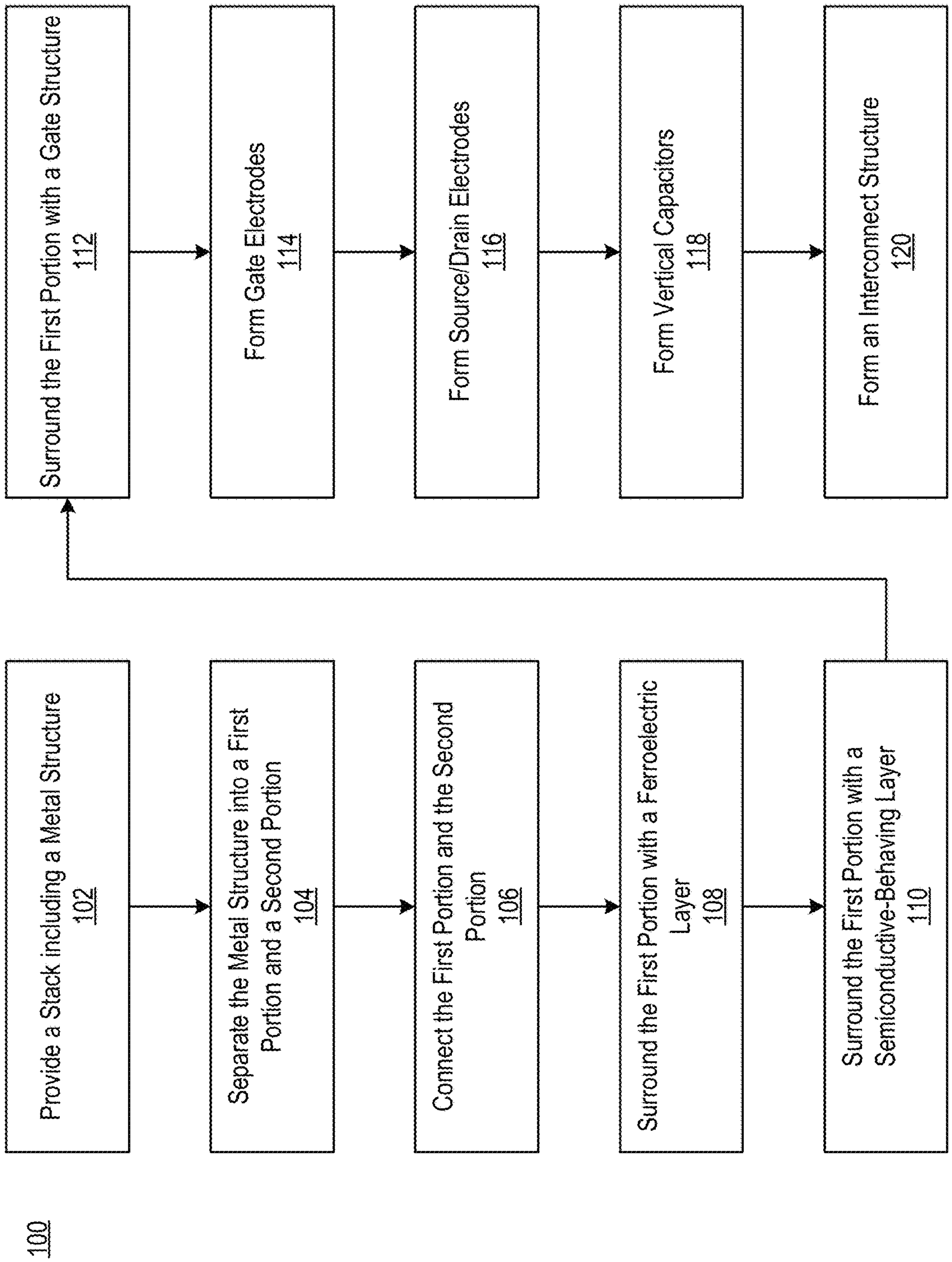
FIG. 1 is a flow diagram for a process flow to manufacture semiconductor devices, according to an embodiment.

Reference will now be made to the illustrative embodiments depicted in the drawings, and specific language will be used here to describe the same. It will nevertheless be understood that no limitation of the scope of the claims or this disclosure is thereby intended. Alterations and further modifications of the inventive features illustrated herein, and additional applications of the principles of the subject matter illustrated herein, which would occur to one skilled in the relevant art and having possession of this disclosure, are to be considered within the scope of the subject matter disclosed herein. Other embodiments may be used and/or other changes may be made without departing from the spirit or scope of the present disclosure. The illustrative embodiments described in the detailed description are not meant to be limiting of the subject matter presented.

Techniques herein include methods and devices for 3D fabrication of semiconductor devices. Specifically, techniques include fabrication of nanosheet 3D transistors for advanced memory elements. For example, the techniques can provide double (e.g., two) gates single horizontal nanosheet transistor for n-bit non-volatile memory cell (e.g., behaves as a 2-bit memory cell) with ferroelectric and conductive oxide channel, thereby creating a horizontal FeAA or GAA nanosheet structure. The techniques can include implementing at least one memory block element with various different electrical (e.g., current) level states, such as four current level states, including but not limited to no current, medium current, lower current, or high current, for example.

The techniques discussed herein can fabricate at least one ferroelectric layer, where when programmed, the channel (e.g., channel structure) can convert or change from medium to high current state according to the power at a switch terminal (e.g., $V_{GS}$). For example, when $V_{GS}=0$, the memory block can hold the charge (e.g., electricity or power) permanently. To perform a read or write operation, power can be provided at the switch terminal, e.g., for the memory block to hold the charge temporarily. By adding a capacitor to the device, the capacity can supply the charge, thereby maintaining the charge in the channel resulting in a permanent state (e.g., permanent power ON). Accordingly, the techniques of the technical solution discussed herein can allow non-volatile memory with the GAA horizontal nanosheet having two gates and at least one vertical capacitor to control the channel (e.g., channel structure) and store n-bit information by changing the voltage via ferroelectric programming. The techniques can provide at least one vertical capacitor at the gate of a pass transistor to permanently hold the charge (e.g., maintain power ON state), improve read and write speed for capacitor, thereby reducing power consumption. Further, the techniques (e.g., non-selective deposition techniques) can allow for various suitable materials to be used for fabricating the semiconductor device, achieving similar results. The techniques can provide pre-defined self-aligned spacer design between source/drain (e.g., S/D) to gate area, and provide compact 'n' stackable design for providing high density memory array, among other improvements to the design or construction of the semiconductor device.

Reference will now be made to the figures, which for the convenience of visualizing the fabrication techniques described herein, illustrate a variety of materials undergoing a process flow in various views. Unless expressly indicated otherwise, each Figure represents one (or a set) of fabrication steps in a process flow for manufacturing the devices described herein. In the various views of the Figures, connections between conductive layers or materials may or may not be shown. However, it should be understood that connections between various layers, masks, or materials may be implemented in any configuration to create electric or electronic circuits. When such connections are shown, it should be understood that such connections are merely illustrative and are intended to show a capability for providing such connections and should not be considered limiting to the scope of the claims.

Likewise, although the Figures and aspects of the disclosure may show or describe devices herein as having a particular shape, it should be understood that such shapes are merely illustrative and should not be considered limiting to the scope of the techniques described herein. For example, the techniques described herein may be implemented in any shape or geometry for any material or layer to achieve desired results. In addition, examples in which two transistors or devices are shown stacked on top of one another are shown for illustrative purposes only, and for the purposes of simplicity. Indeed, the techniques described herein may provide for one to any number of stacked devices. Further, although the devices fabricated using these techniques are shown as transistors, it should be understood that any type of electric electronic device may be manufactured using such techniques, including but not limited to transistors, variable resistors, resistors, and capacitors.

FIG. 1 illustrates a flowchart of an example method 100 for forming a semiconductor device. For example, the semiconductor device can include a plurality of memory cells such as memory cells for a non-volatile memory device. Various memory cells can be interconnected to form arrays. For example, various instances of the memory cells formed according to the method 100 may be laterally or horizontally spaced from each other (e.g., according to a row or column). Further, various instances of the memory cells formed according to the method 100 may be stacked over or adjacent to each other, such as in a repeating pattern. The various interconnections can be connected to form logical rows, columns, pages, blocks, and so forth.

In various embodiments, operations of the method 100 may be associated with top, cross-sectional, perspective, or other views of an example semiconductor device at various fabrication stages as shown in FIGS. 2 to 21, which will be discussed in further detail below. It should be understood that the semiconductor device 200, shown in FIGS. 2 to 21, may include a number of other devices such as inductors, fuses, capacitors, coils, etc., while remaining within the scope of the present disclosure. For example, a semiconductor device can include further layers of stacked transistors or channel portions thereof and interconnections therebetween.

In brief overview, the method 100 includes at least but not limited to operations 102-120. At operation 102, the method 100 includes providing or forming a stack including a metal structure. At operation 104, the method 100 includes separating the metal structure into a first portion and a second portion. At operation 106, the method 100 includes connecting the first portion and the second portion (e.g., forming a third portion). At operation 108, the method 100 includes surrounding the first portion with a ferroelectric layer (e.g., forming the ferroelectric layer). At operation 110, the method 100 includes surrounding the first portion with a semiconductive-behaving layer (e.g., forming the semiconductive-behaving layer). At operation 112, the method 100 includes surrounding the first portion with a gate structure (e.g., forming the gate structure). At operation 114, the method 100 includes forming gate electrodes. At operation 116, the method 100 includes forming S/D electrodes. At operation 118, the method 100 includes forming vertical capacitors. At operation 120, the method 100 includes forming an interconnect structure. The method 100 continues to operation 122 of forming device interconnects. According to various embodiments, various operations of the method 100 may be omitted, added, modified, or combined. The operations of the method 100 may be performed sequentially or concurrently. The operations of the method 100 can be performed in other order or sequence, not limited to those described herein.

Figure 2:
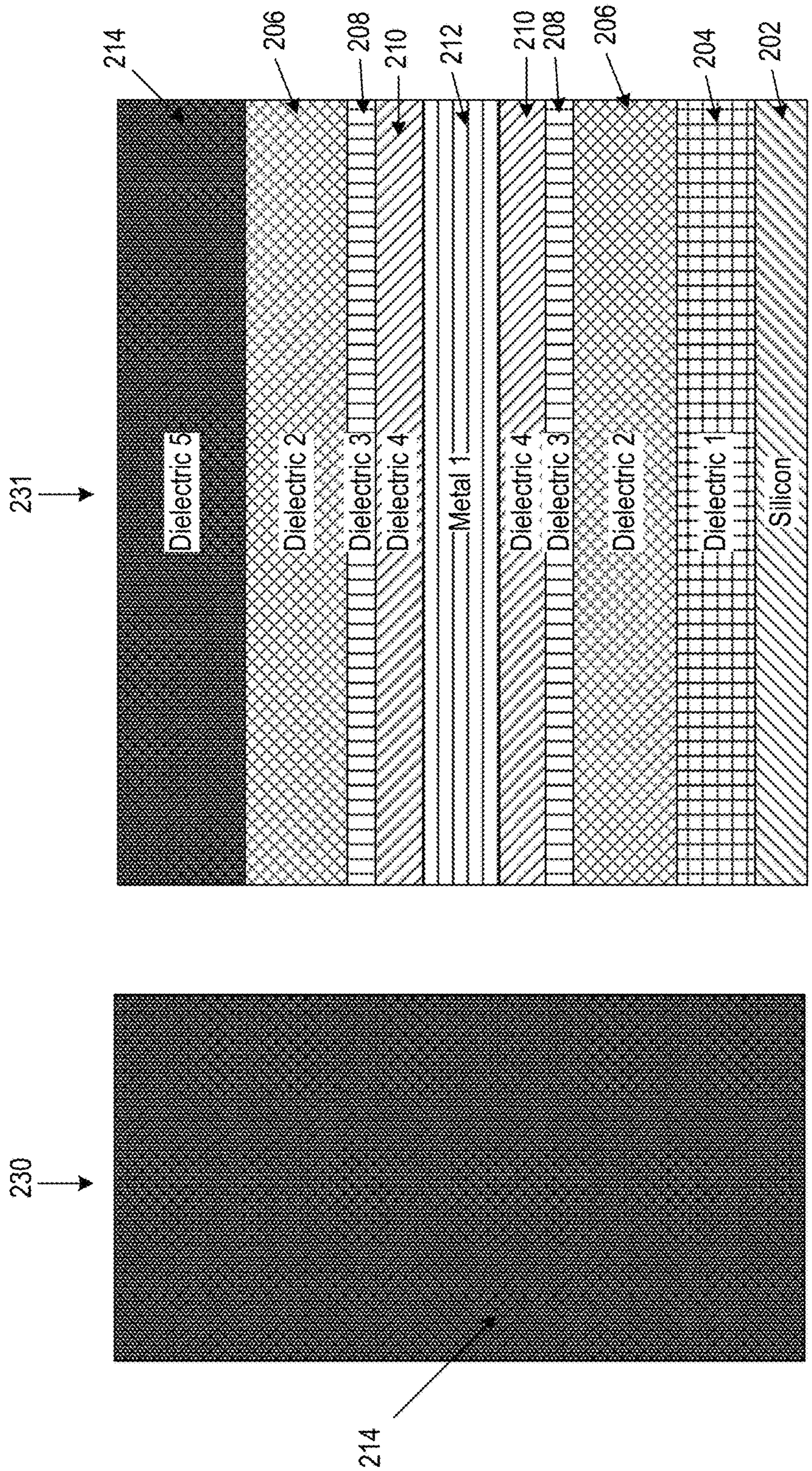
FIGS. 2-13 show various views of a first process flow to manufacture semiconductor devices with 3D ferroelectric horizontal nanosheet FET for n-bit memory cell element, according to an embodiment.

Corresponding to operation 102 of FIG. 1, FIG. 2 shows a top view 230 and a cross-sectional view 231 of the semiconductor device 200 in which, a stack including a metal structure 212 (e.g., shown in the legend as "Metal 1") is formed. The cross-sectional view 231 shows a side of the semiconductor device 200 extending along a first lateral direction (e.g., x-axis referring to the top view 230). As shown in FIG. 2, a plurality of semiconductor materials can be deposited over a silicon 202 (e.g., substrate) various dielectric, metal, and hard mask materials, to form a stack. Although the silicon 202 is used as an example substrate, other elementary semiconductor materials can be used as the substrate of the semiconductor device 200, including but not limited to germanium, gallium arsenide, etc. In some cases, the substrate can include a compound semiconductor such as silicon carbide, gallium arsenic, indium arsenide, and indium phosphide. In some cases, the substrate can include an alloy semiconductor, such as silicon germanium, silicon germanium carbide, gallium arsenic phosphide, and gallium indium phosphide.

A number of dielectric materials can be deposited above the silicon 202, not limited to those shown in at least FIG. 2. For example, a first dielectric material can be deposited over the silicon 202 to form a dielectric layer 204 (e.g., shown in the legend as "Dielectric 1"). The first dielectric material can be deposited using any suitable deposition technique, such as but not limited to physical vapor deposition (PVD), chemical vapor deposition (CVD), electroplating, or so forth. Other materials discussed herein can be deposited using a similar or different suitable deposition technique. A second dielectric material can be deposited over the dielectric layer 204 to form a dielectric layer 206 (e.g., shown in the legend as "Dielectric 2"). The second dielectric material can be different from the first dielectric material. A third dielectric material can be deposited over the dielectric layer 206 to form a dielectric layer 208 (e.g., shown in the legend as "Dielectric 3"). The third dielectric material can be similar to or different from at least one of the dielectric layers 204, 206. A fourth dielectric material can be deposited over the dielectric layer 208 to form dielectric layer 210 (e.g., shown in the legend as "Dielectric 4"). The fourth dielectric material can be similar to or different from at least one of the dielectric layers 204, 206, 208.

Each of the dielectric layers 204, 206, 208, 210 can be formed with a predetermined dimension (e.g., thickness, height, or length). For instance, a relatively longer duration of depositing at least one of the dielectric materials can increase the thickness of the respective at least one of the dielectric layers 204, 206, 208, 210. In another example, a relatively shorter duration of depositing at least one of the dielectric materials can decrease or lower the thickness of the respective at least one of the dielectric layers 204, 206, 208, 210. As discussed herein, a predetermined dimension can be configured for depositing or forming the various materials or layers according to the configuration of the semiconductor device 200, not limited to those provided herein.

After forming the dielectric layer 210, a metal fill or material can be deposited over the dielectric layer 210 to form the metal structure 212. The metal fill (e.g., sometimes referred to as metal material) may be formed according to any suitable process, such as physical vapor deposition (PVD), chemical vapor deposition (CVD), electroplating, or so forth. As shown in FIG. 2, additional dielectric layers 206, 208, 210 can be deposited above the metal structure 212. These dielectric layers 206, 208, 210 can be formed in the order of dielectric layer 210, dielectric layer 208, and dielectric layer 206 over the metal structure 212, or in other order. A fifth dielectric material can be deposited over the exposed dielectric layer 206 to form dielectric layer 214 (e.g., shown in the legend as "Dielectric 5").

Figure 3:
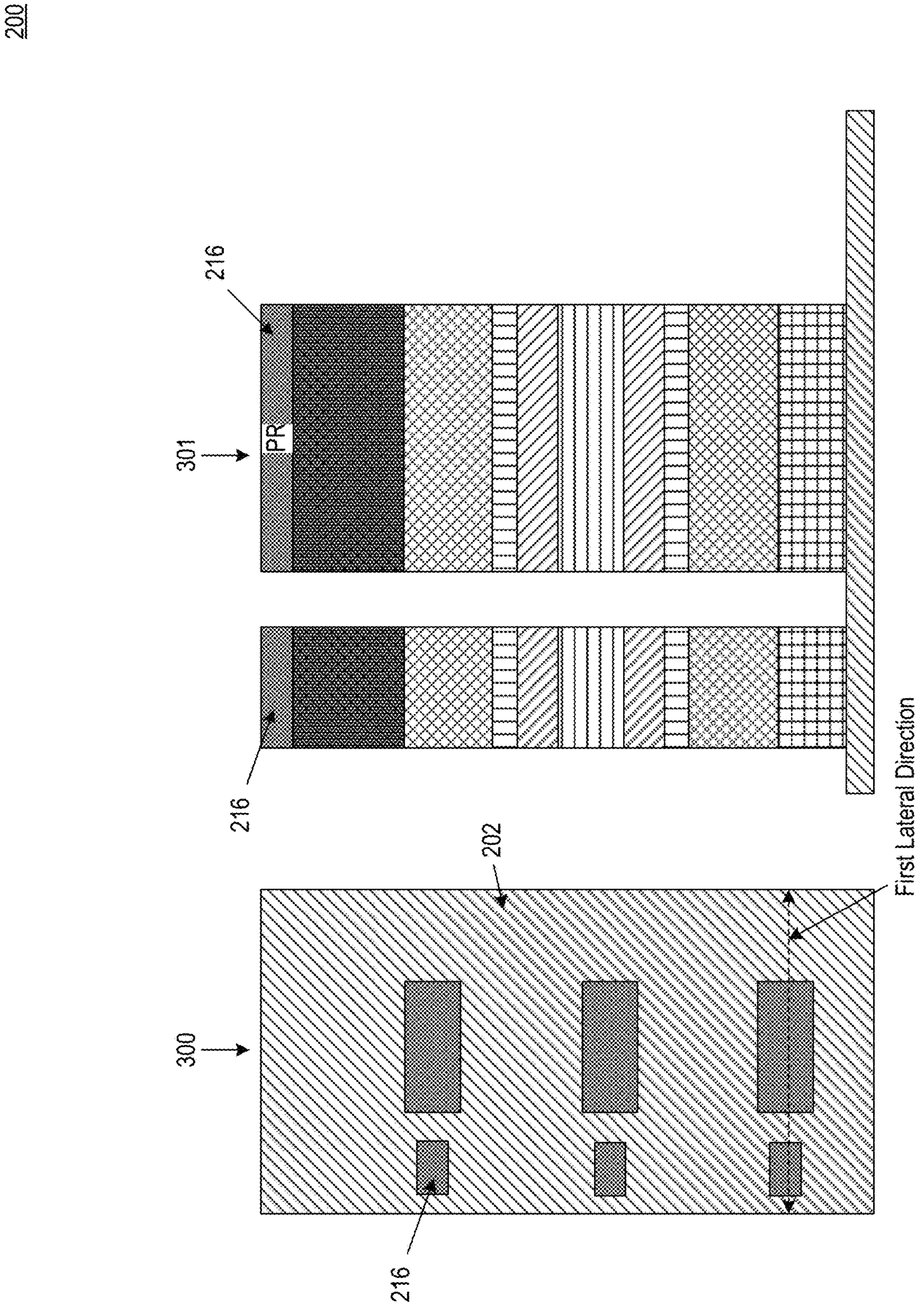

Corresponding to operation 104 of FIG. 1, FIG. 3 shows a top view 300 and a cross-sectional view 301 of the semiconductor device 200 in which the metal structure 212 is separated into a first portion and a second portion. The cross-sectional view 301, among other cross-sectional views discussed herein can show a respective side of the semiconductor device 200 extending along the first lateral direction (e.g., x-axis referring to the top view 300). For example, a patternable layer (not shown), such as a positive or negative photoresist mask with patterns can be formed over the semiconductor device 200. The patternable layer may include a periodic pattern such that periodic openings are formed across the semiconductor device 200, including openings formed for depositing materials in a predetermined pattern or form. The patternable layer may interface with a photoresist, or another material (e.g., hard mask or other mask material) formed into openings of the patternable layer to form a patterned layer. In this case, the photoresist (PR) material can be deposited via the openings of the patternable layer to form a PR layer 216 (e.g., shown in the legend as "PR"). The PR layer 216 can correspond to or be referred to as a hard mask. The PR layer 216 can include or be provided with a horizontal nanosheet mask. In some cases, the PR layer 216 may correspond to the patternable layer. The upper surface of the semiconductor device 200 and the PR layer 216 may have different etching selectivity. For example, the PR layer 216 may be more resistive to an etchant than the material (e.g., the various dielectric materials or the metal fill) of the semiconductor device 200.

Using the PR layer 216 (e.g., the hard mask formed over the dielectric layer 214), a portion of the semiconductor device 200 can be etched using at least one suitable technique, including but not limited to at least one of dry etching, wet etching, plasma etching, chemical mechanical polishing (CMP), or other etching techniques. Portions of the semiconductor device 200 can be removed by utilizing the at least one suitable etching technique. Similar or different etching techniques can be utilized herein for etching or removing materials. As shown in the top view 300, portions of the stack of the semiconductor device 200, not covered by the PR layer 216 can be removed after performing the etching process. For example, the etching process can remove portions of at least one of the dielectric layers 204, 206, 208, 210, 204 and the metal structure 212, depending on the configuration. In this case, the etching process can expose the silicon 202 (e.g., the substrate), e.g., the etching stops on the silicon 202, although the etching may remove more or less materials or layers depending on the configuration. Accordingly, the stack of dielectric layers 204, 206, 208, 210, 204 and the metal structure 212 can be separated into two portions (e.g., a first portion and a second portion). In some cases, the first portion can refer to the right portion, and the second portion can refer to the left portion of the semiconductor device 200.

In some configurations, the PR layer 216 can be removed after performing the etching process. In some other configurations, the PR layer 216 can be maintained on the semiconductor device 200 (or over certain materials or structures) after performing the (e.g., initial) etching process. The PR layer 216 can be removed, for instance, by a combination of dry and wet etching processes, among other types of etching techniques. As discussed herein, the PR layer 216 may be maintained or removed after individual etching processes, depending on the configuration of the fabrication process.

Figure 4:
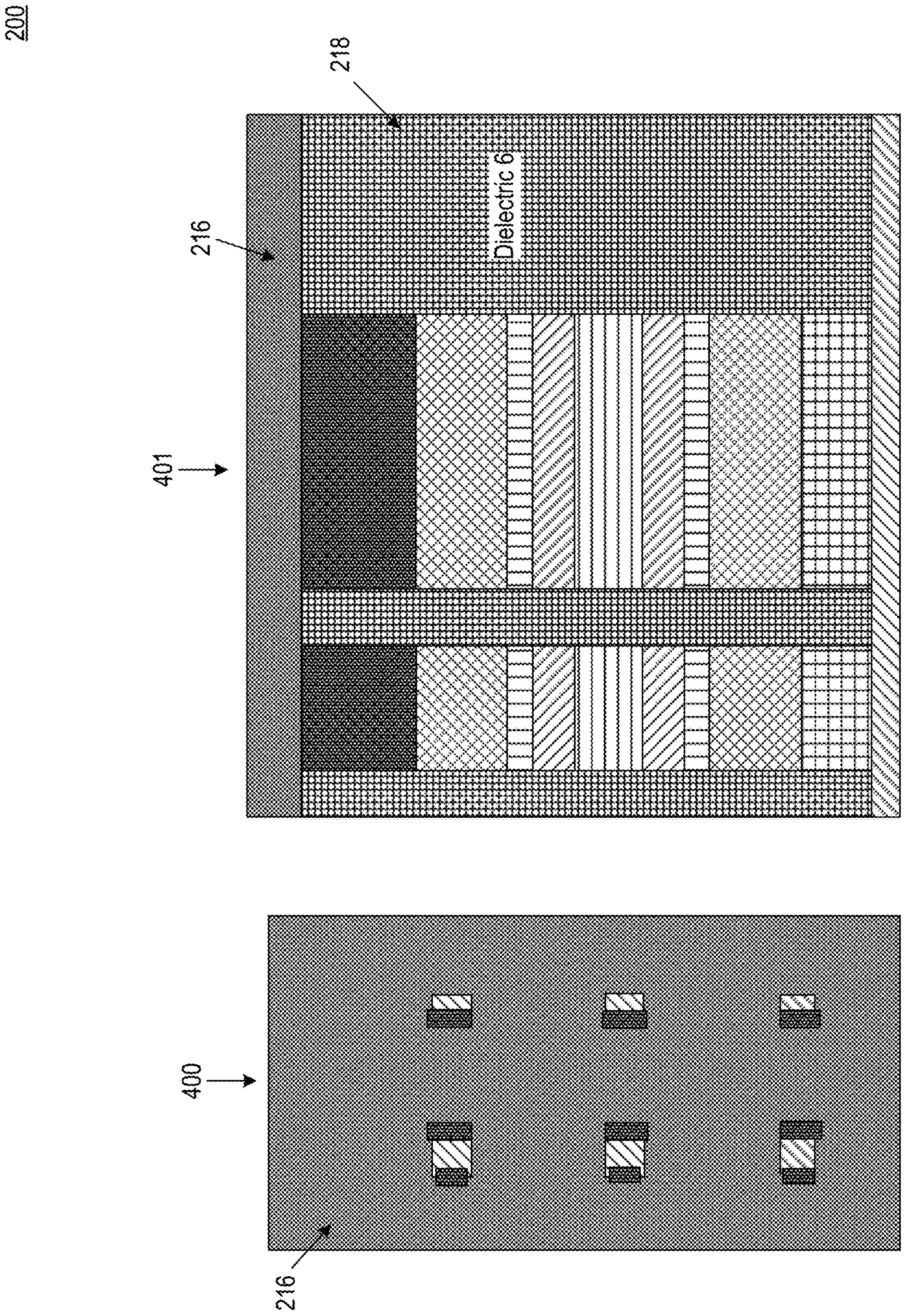

FIG. 4 shows a top view 400 and a cross-sectional view 401 of the semiconductor device 200 in which a sixth dielectric material is deposited to fill various etched-out portions of the semiconductor device 200. As shown, after separating the stacks into the first portion and the second portion, the sixth dielectric material can be deposited between or around the first portion and the second portion of the stack, forming a dielectric structure 218. The dielectric structure 218 can include or be composed of similar or different dielectric materials from other dielectric layers 204, 206, 208, 210, 214. In some implementations, the term sixth dielectric material can be used interchangeably with the dielectric structure 218.

The hard mask (e.g., PR layer 216) with a predefined pattern can be deposited over the semiconductor device 200 after depositing the dielectric structure 218. In this case, the PR layer 216 can include or correspond to an S/D contact mask. The PR layer 216 can include openings between the first portion and the second portion of the stack, as shown in at least the top view 400, for example. The dielectric layer 216, including those at the sides (e.g., left and right sides in the lateral direction) of the first portion of the stack, can be etched using at least one suitable etching technique. The etching process can expose the silicon 202 via openings between the first portion and the second portion of the stack, and at the right side of the first portion.

Figure 5:
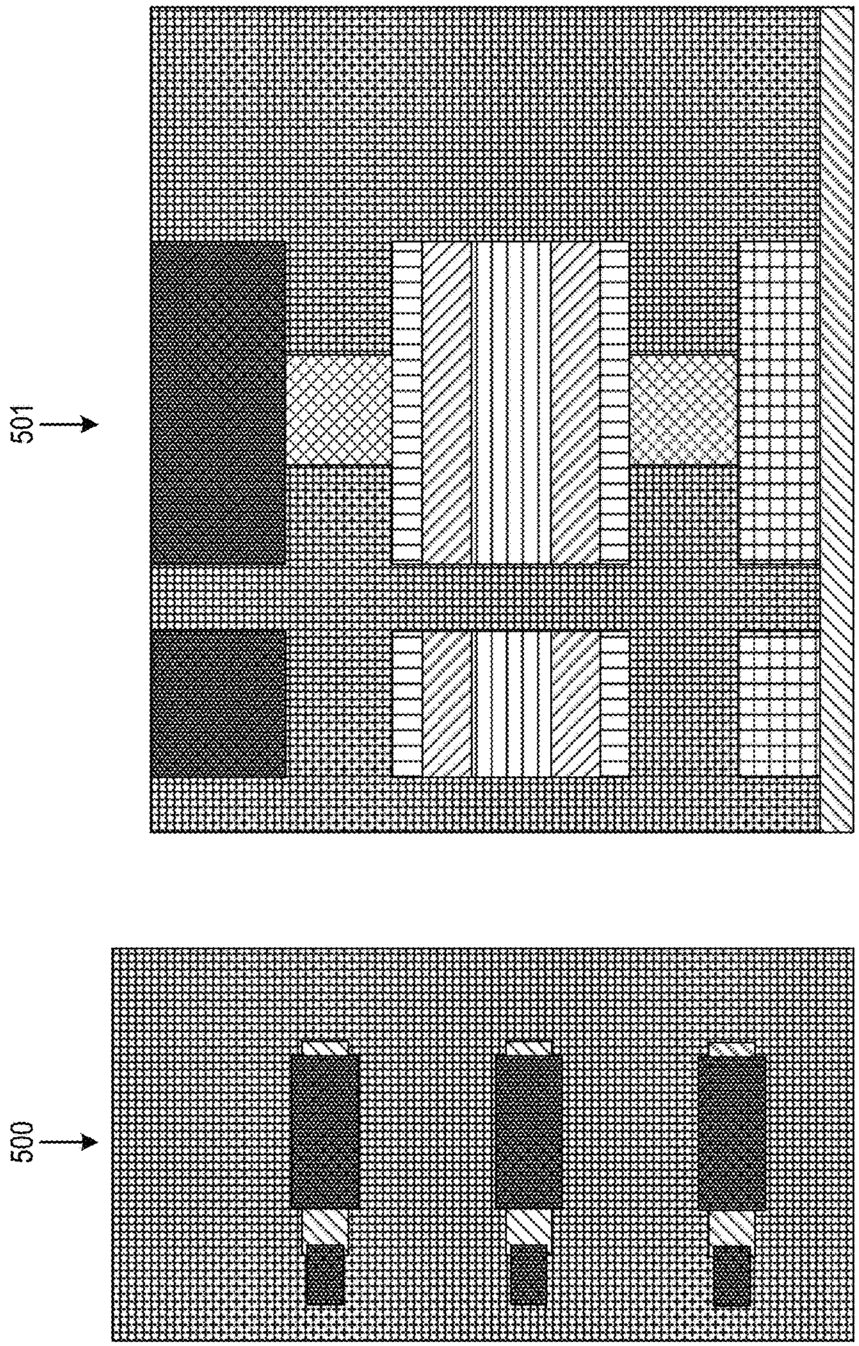

FIG. 5 shows a top view 500 and a cross-sectional view 501 of the semiconductor device 200 in which spacers for the S/D and gate electrodes are defined. After forming the openings, a portion of the dielectric layer 206 can be removed by performing a recess etch process to horizontally remove materials (e.g., etching materials in the first lateral direction). For example, portions or the entirety of the dielectric layer 206 in the second portion of the stack can be removed via the opening formed in the process described in conjunction with at least FIG. 4. Further, portions of the dielectric layer 206 in the first portion can be removed via the openings. Portions of the dielectric layer 206, including the top portion and the bottom portion, can be maintained between the dielectric layers 214 and 208, and between dielectric layers 208 and 204, respectively, as shown in the cross-sectional view 501. The recessed dielectric layer 206 can define spacers for the S/D and gate electrodes.

Figure 6:
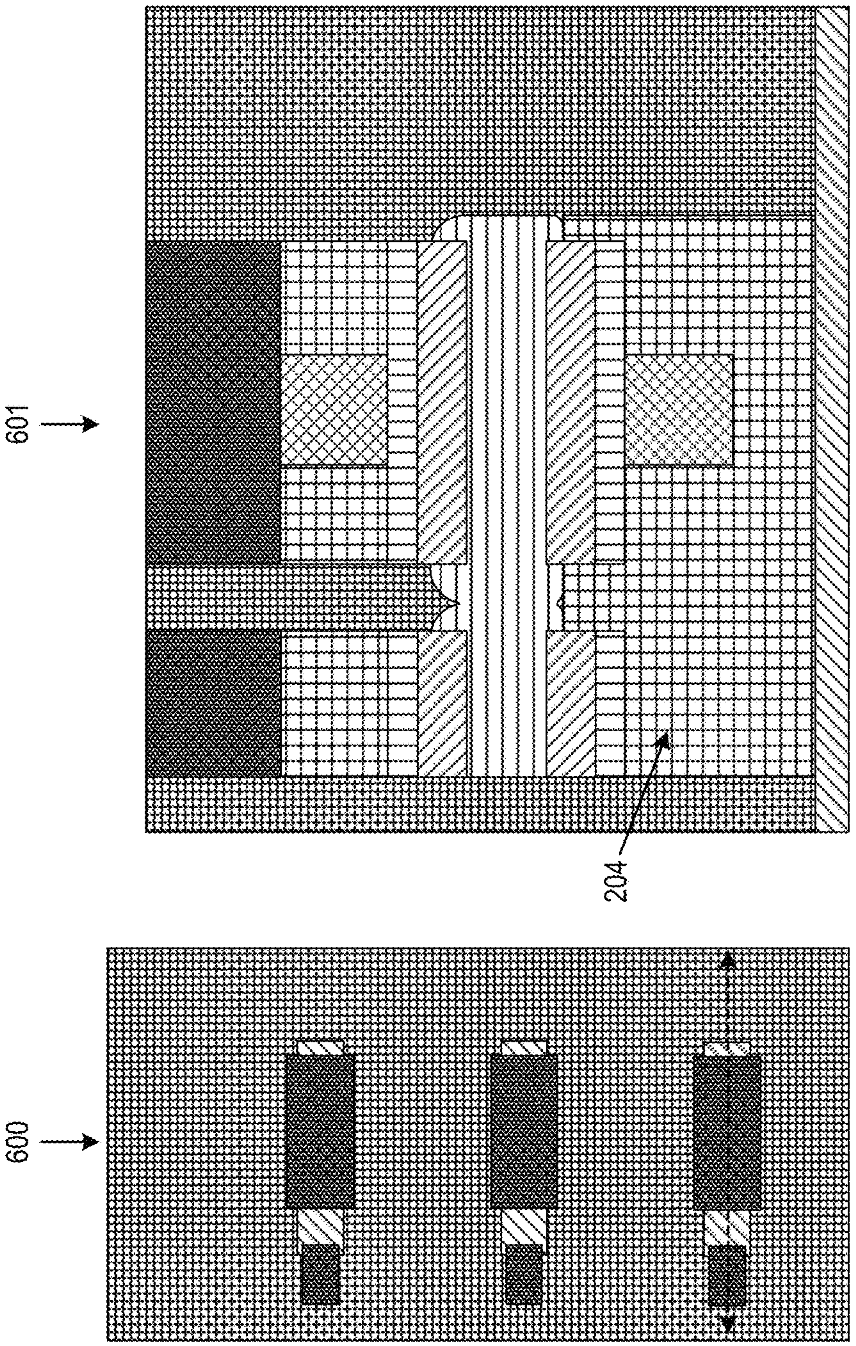

Corresponding to operation 106 of FIG. 1, FIG. 6 shows a top view 600 and a cross-sectional view 601 of the semiconductor device 200 in which the first portion of the metal structure 212 is connected with the second portion of the metal structure 212. As shown, the first dielectric material (e.g., of dielectric layer 204) can be deposited into the openings and recessed portions of the dielectric layer 206 formed from the one or more etching processes. For example, the first dielectric material can be deposited to fill the recessed portions of the dielectric layer 206. In this case, the dielectric layer 206 in the first portion can be interposed between the first dielectric material (e.g., the dielectric layer 204). Further, the first dielectric material can be deposited into the opening, extending in the vertical direction. In some embodiments, the first dielectric material can be deposited to fill the opening up to around the metal structure 212. For example, the top surface of the first dielectric material filling the opening can be below the metal structure 212, adjacent to the dielectric layer 210, or align with the top surface of the dielectric layer 210. In another example, the top surface of the first dielectric material filling the opening can be adjacent to the metal structure 212, while still exposing a portion of the side of the metal structure 212.

In some embodiments, the openings and recessed portion can be filled with the first dielectric material, such as up to at least the dielectric layer 214. After depositing the first dielectric material in the opening, a patterned hard mask (e.g., PR layer 216) can be formed, and an etching process (e.g., wet etching or other suitable etching technique) can be performed to etch down the first dielectric material in the opening. The etching process can be configured with a time stop, for instance, configured to increase or decrease the depth of the etching. The first dielectric material can be etched until the metal structure 212 (e.g., the entirety or a portion of the metal structure 212) is exposed via the opening. Subsequently, a metal fill can be deposited to connect or join the first portion of the metal structure 212 and the second portion of the metal structure 212, thereby extending the gate contact. The metal fill joining the two portions of the metal structure 212 can be referred to as or include a third portion of the metal structure 212. As shown, the metal fill can extend the metal structure 212 in the first lateral direction.

In some implementations, the metal fill can be deposited non-selectively. For example, to connect the two portions of the metal structure 212, the metal fill can be deposited into the formed openings non-selectively. After the deposition, the metal fill can be etched laterally past the dielectric layer 208. In some cases, the metal fill can be etched past the dielectric layer 210 above the metal structure 212.

Figure 7:
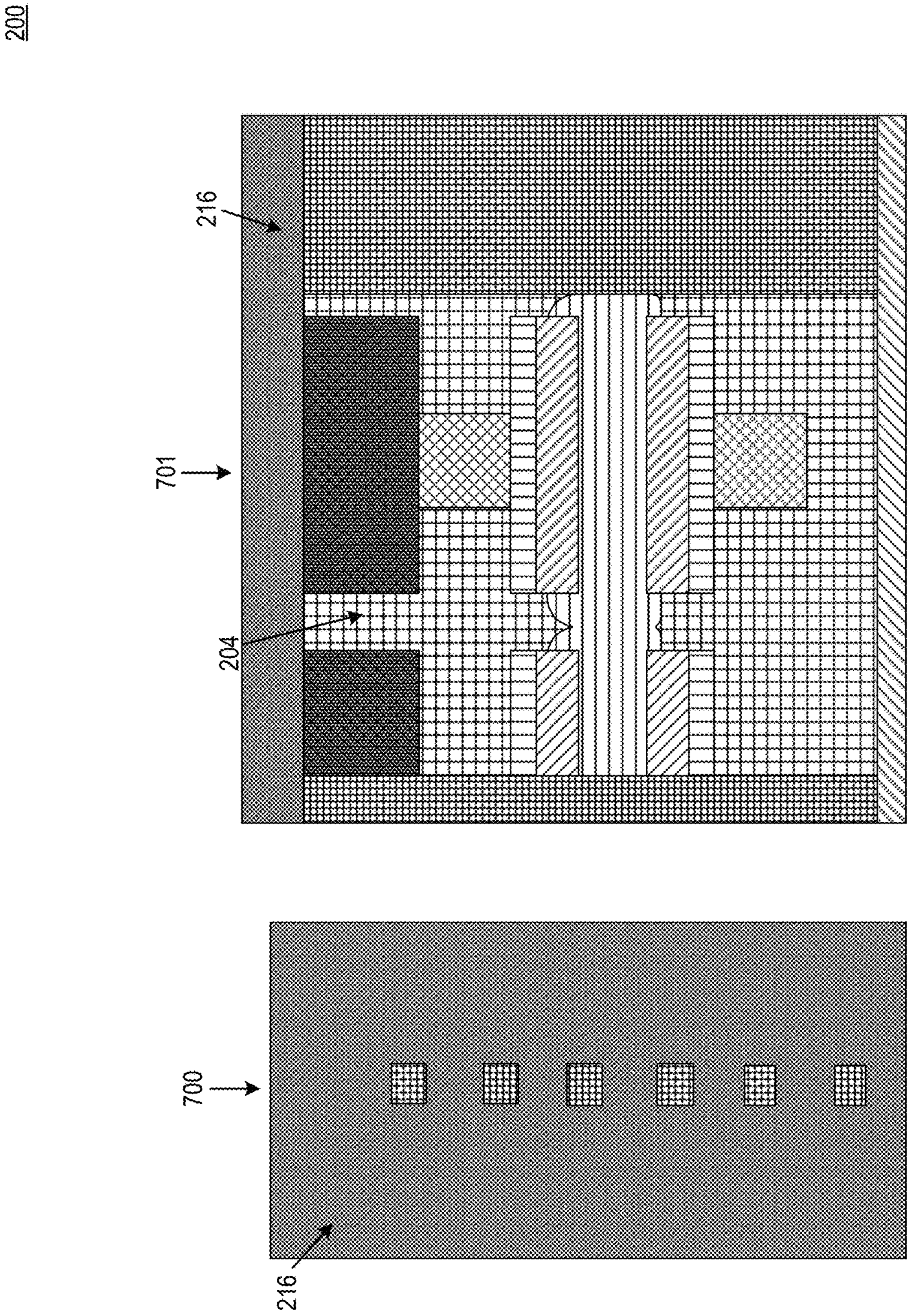

FIG. 7 shows a top view 700 and a cross-sectional view 701 of the semiconductor device 200 in which the remaining openings are filled. As shown, after depositing the metal fill, the first dielectric material can be deposited into the remaining opening of the semiconductor device 200. The first dielectric material can be deposited vertically up to or above the dielectric layer 206 or the dielectric layer 214. For example, the top surface of the deposited first dielectric material can be aligned with the dielectric layer 214, for example. The deposited first dielectric material can be etched (e.g., CMP or other suitable etching technique) to lower the top surface of the first dielectric material to the top surface of the dielectric layer 214, for example.

After depositing the first dielectric material, a patterned mask (e.g., gate contact mask or the PR layer 216) can be formed over the semiconductor device 200. As shown, the PR layer 216 can include various openings to expose portions of the dielectric structure 218. The openings of the PR layer 216 can be positioned to expose the sides (e.g., in a second lateral direction) of the materials of the stack, including at least one of but not limited to the dielectric layers 206, 208, 210, such as after performing the etching process. For example, with the PR layer 216, at least one suitable etching technique can be performed to etch the materials (e.g., the dielectric structure 218), stopping at a lower portion of the semiconductor device 200. In some cases, the etching process can expose the silicon 202. In some other cases, the etching process may stop at the dielectric layer 204 above the silicon 202, or at other layers, exposing the sides (e.g., in the second lateral direction) of at least one of but not limited to the dielectric layer 206, 208, 210, or the metal structure 212.

Figure 8:
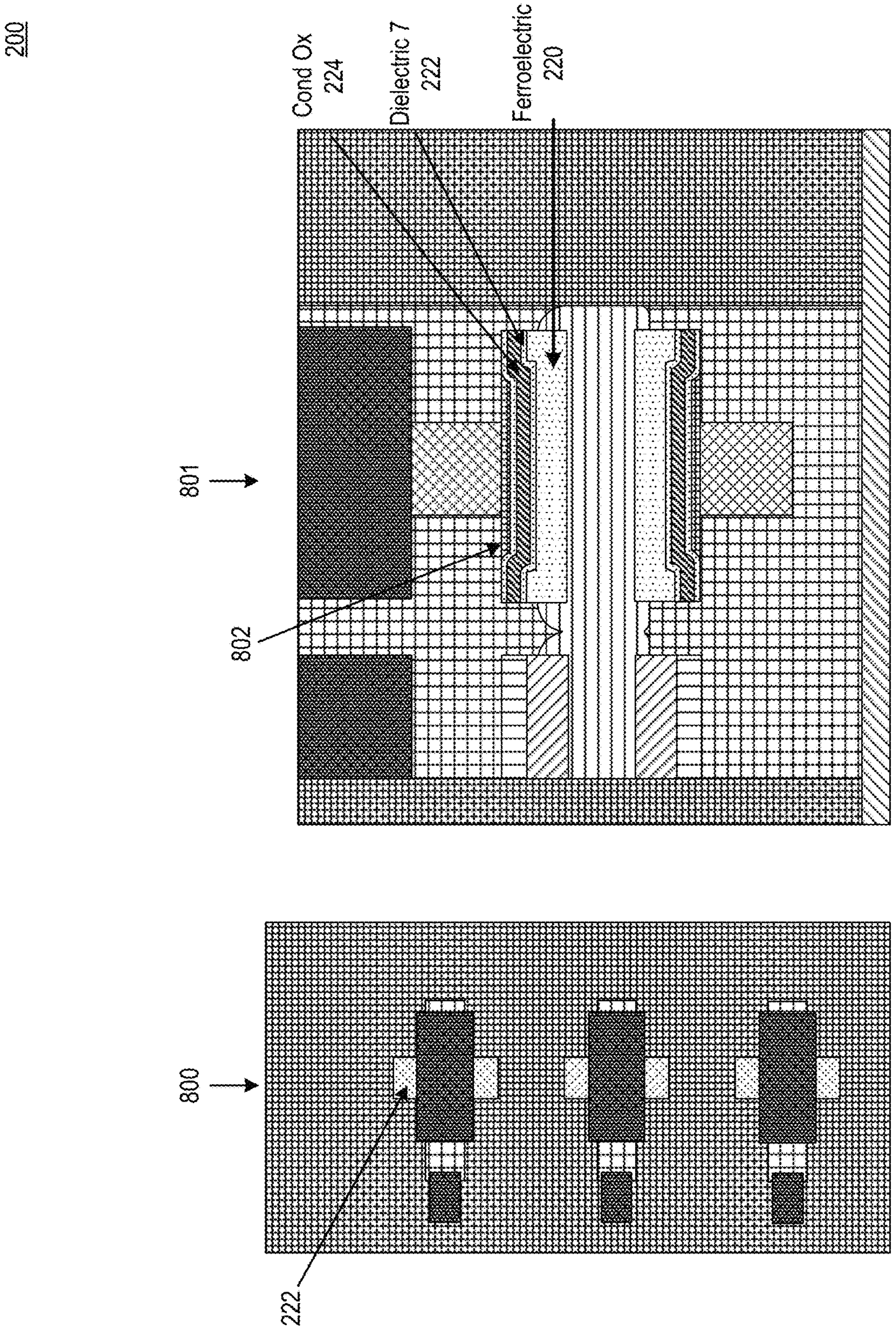

Corresponding to operations 108 and 110 of FIG. 1, FIG. 8 shows a top view 800 and a cross-sectional view 801 of the semiconductor device 200 in which ferroelectric material, dielectric material, and conductive oxide material are deposited surrounding the metal structure 212. As shown, the dielectric layers 208, 210 associated with the first portion of the stack (e.g., interposing the metal structure 212) can be replaced with at least one of but not limited to a ferroelectric material, a seventh dielectric material, and a conductive oxide material. For example, via the formed openings, described in conjunction with FIG. 7, the dielectric layer 210 surrounding the metal structure 212 (e.g., in the second lateral direction) and interposed between the dielectric layer 208 can be accessed. The dielectric layer 210 can be etched using at least one suitable etching technique via the openings. After removing the dielectric layer 210 surrounding the metal structure 212 (e.g., the first portion of the metal structure 212), the ferroelectric material can be selectively deposited to surround the first portion of the metal structure 212, thereby forming a ferroelectric layer 220 (e.g., shown in the legend as "Ferroelectric").

Subsequently, the dielectric layer 208 can be etched using at least one suitable etching technique, accessed via the openings formed on the sides (e.g., in the second lateral direction) of the metal structure 212. Removing the dielectric layer 208 can create a spacing or a gap between the ferroelectric layer 220 and at least the dielectric layer 206. In at least a portion of the spacing, the seventh dielectric material can be deposited surrounding the ferroelectric layer 220 (and the metal structure 212) using at least one suitable deposition technique, forming a dielectric layer 222. In at least a portion of the spacing, the conductive oxide material can be deposited surrounding at least one of the dielectric layer 222, the ferroelectric layer 220, or the metal structure 212, thereby forming a conductive oxide structure 224. Another seventh dielectric material can be deposited to surround at least one of the conductive oxide structure 224, the dielectric layer 222, the ferroelectric layer 220, or the metal structure 212, forming another dielectric layer 222. The conductive oxide structure 224 can be interposed between the dielectric layers 222, which surrounds the sides of the metal structure 212, e.g., in the second lateral direction. The conductive oxide structure 224 can be separated from the ferroelectric layer 220 by the dielectric layer 222.

In some implementations, the conductive oxide material can include or be referred to as a semiconductive-behaving material. The conductive oxide structure 224 and the dielectric layer 222 can form a channel layer with respect to the metal structure 212. For example, for a first metal structure, the conductive oxide structure 224 and the dielectric layer 222 can form a first channel layer. For a second metal structure, the conductive oxide structure 224 and the dielectric layer 222 associated with the second metal structure can form a second channel layer, for example.

In some configurations, at least a portion of the spacing (e.g., 802) formed from removing the dielectric layer 208 may remain unfilled, surrounding the (e.g., outer-most) dielectric layer 222, such as shown in at least the cross-sectional view 801 of FIG. 8. This portion of the spacing may be filled when depositing a high-k material, such as described in conjunction with at least FIG. 9, for example.

In some arrangements, the dielectric layer 208 may be etched before or concurrent with the etching of the dielectric layer 210. In some arrangements, the seventh dielectric material and the conductive oxide material can be deposited before or concurrent with the deposition of the ferroelectric material.

Figure 9:
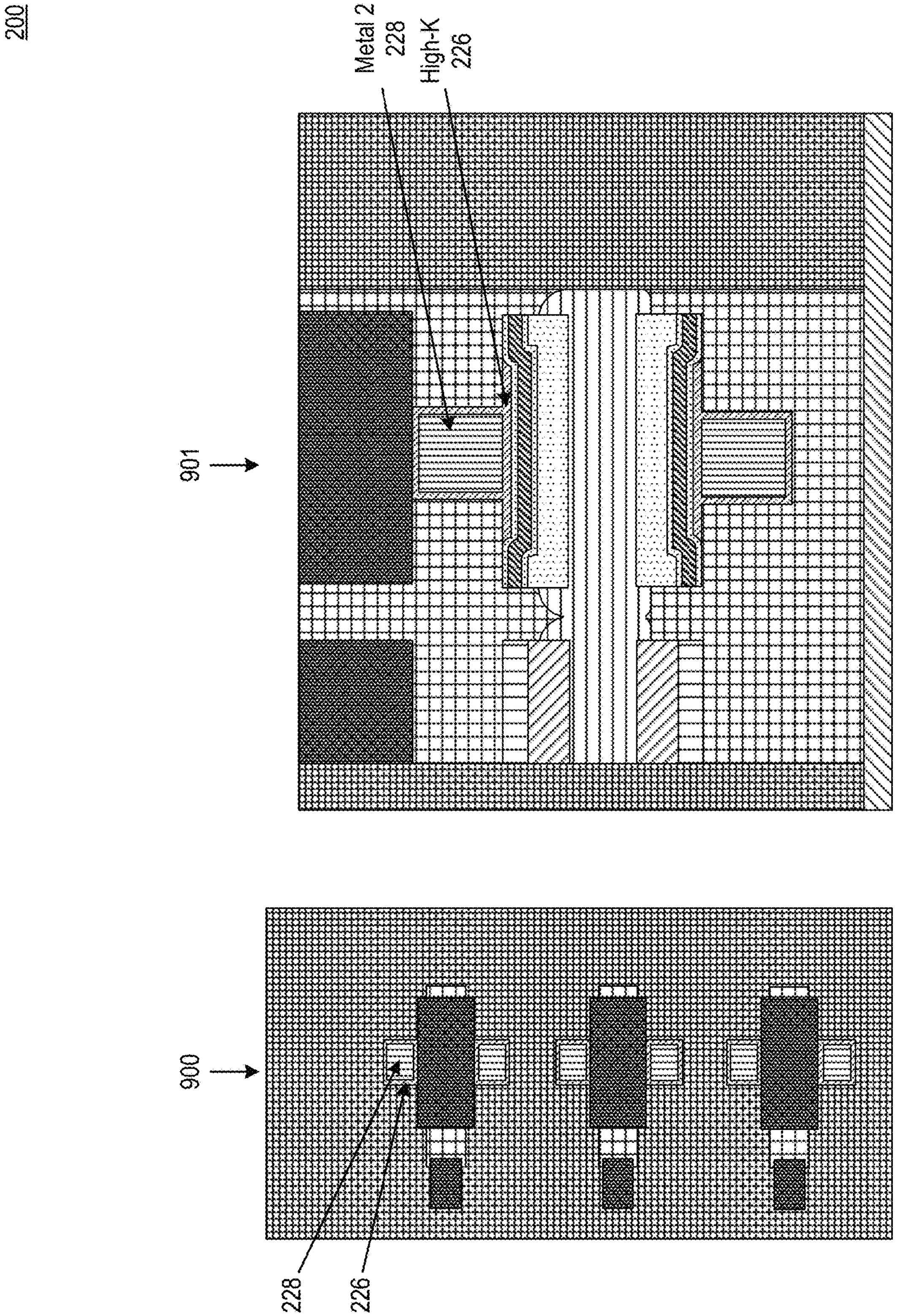

Corresponding to operation 112 of FIG. 1, FIG. 9 shows a top view 900 and a cross-sectional view 901 of the semiconductor device 200 in which a gate structure is formed. After forming the channel layer (e.g., including the dielectric layer 222 and the conductive oxide structure 224), the dielectric layer 206 can be etched using at least one suitable etching technique. The dielectric layer 206 can be removed via the openings formed as described in conjunction with at least FIG. 7. Then, a thin layer of the high-k dielectric material 226 (e.g., shown in the legend as "High-K") can be deposited conformally, for example, using an atomic layer deposition (ALD) technique or other suitable deposition techniques. The deposited high-k dielectric material 226 can surround the metal structure 212, among other structures interposed therebetween.

After depositing the high-k dielectric material 226, a metal fill can be deposited surrounding the high-k dielectric material 226, the metal structure 212, or other structures interposed therebetween, forming a metal structure 228 (e.g., shown in the legend as "Metal 2"). In this case, the metal structure 228 and the high-k dielectric material 226 can form a gate structure that surrounds the first portion of the metal structure 212, with the ferroelectric layer 220 and the first channel layer (e.g., including the dielectric layer 222 and the conductive oxide structure 224) interposed therebetween. In some cases, an etching process can be performed using at least one suitable etching technique, such as CMP, to reduce the height of the deposited metal structure 228 or the high-k dielectric material 226, for example. The surface of the deposited metal structure 228 may be exposed via the openings, such as shown in at least the top view 900.

Figure 10:
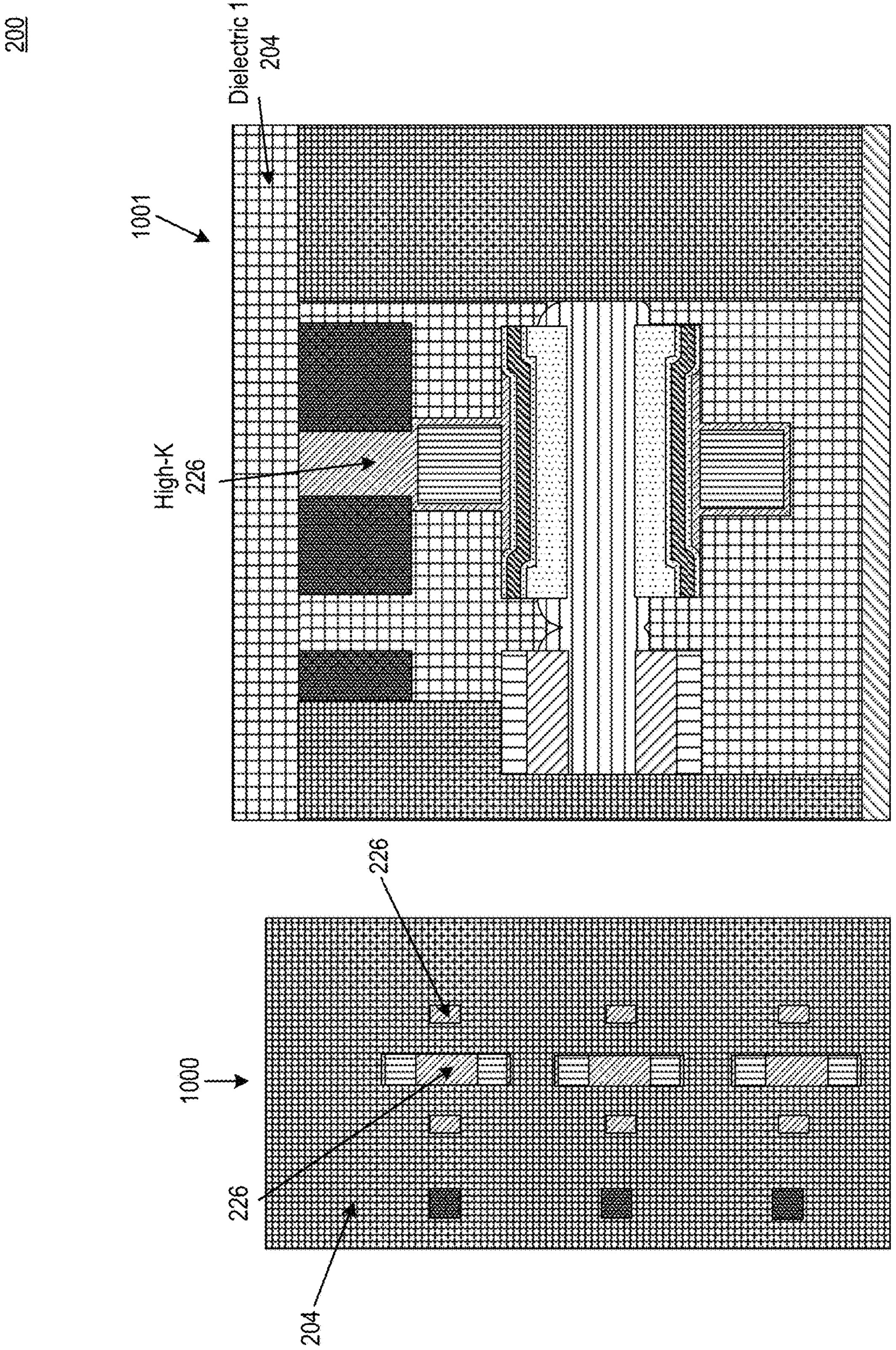

FIG. 10 shows a top view 1000 and a cross-sectional view 1001 of the semiconductor device 200 in which outer connections are formed. For example, a dielectric material, such as but not limited to the first dielectric material, can be deposited over the semiconductor device 200. The deposited first dielectric material can fill the openings, such as the openings exposing the surface of the metal structure 228.

A patterned mask (e.g., the PR layer 216) can be formed over the semiconductor device 200. For example, the mask can include various openings, such as openings extending in the second lateral direction or openings in the first lateral direction, such as shown in at least the top view 1000 of FIG. 10. At least one suitable etching technique can be utilized to remove portions of the materials via the openings of the mask, including but not limited to portions of the dielectric layer 204 formed over the semiconductor device 200 and the dielectric layer 214 above the gate structure. After performing the etching technique, at least the surface of the metal structure 228 can be exposed in the openings extending in the second lateral direction. Further, by performing the etching technique, at least one of but not limited to a portion of the dielectric layer 222, a portion of the conductive oxide structure 224, a portion of the high-k dielectric material 226, or the second portion of the metal structure 212 can be exposed via the openings formed by the etching process. As discussed above, responsive to performing the etching process using the PR layer 216 (e.g., the mask), the PR layer 216 can be removed, exposing the top surface of the semiconductor device 200.

With the metal structure 228 exposed, the high-k dielectric material 226 can be deposited into the opening, extending in the vertical direction. The high-k dielectric material 226 can be deposited over a portion of the metal structure 228, where other portions of the metal structure 228 can remain exposed. The high-k dielectric material 226 deposited in the openings can be etched using at least one suitable etching technique to lower the high-k dielectric material 226 to around (e.g., just above, below, or at) the top surface of the dielectric layer 214.

Figure 11:
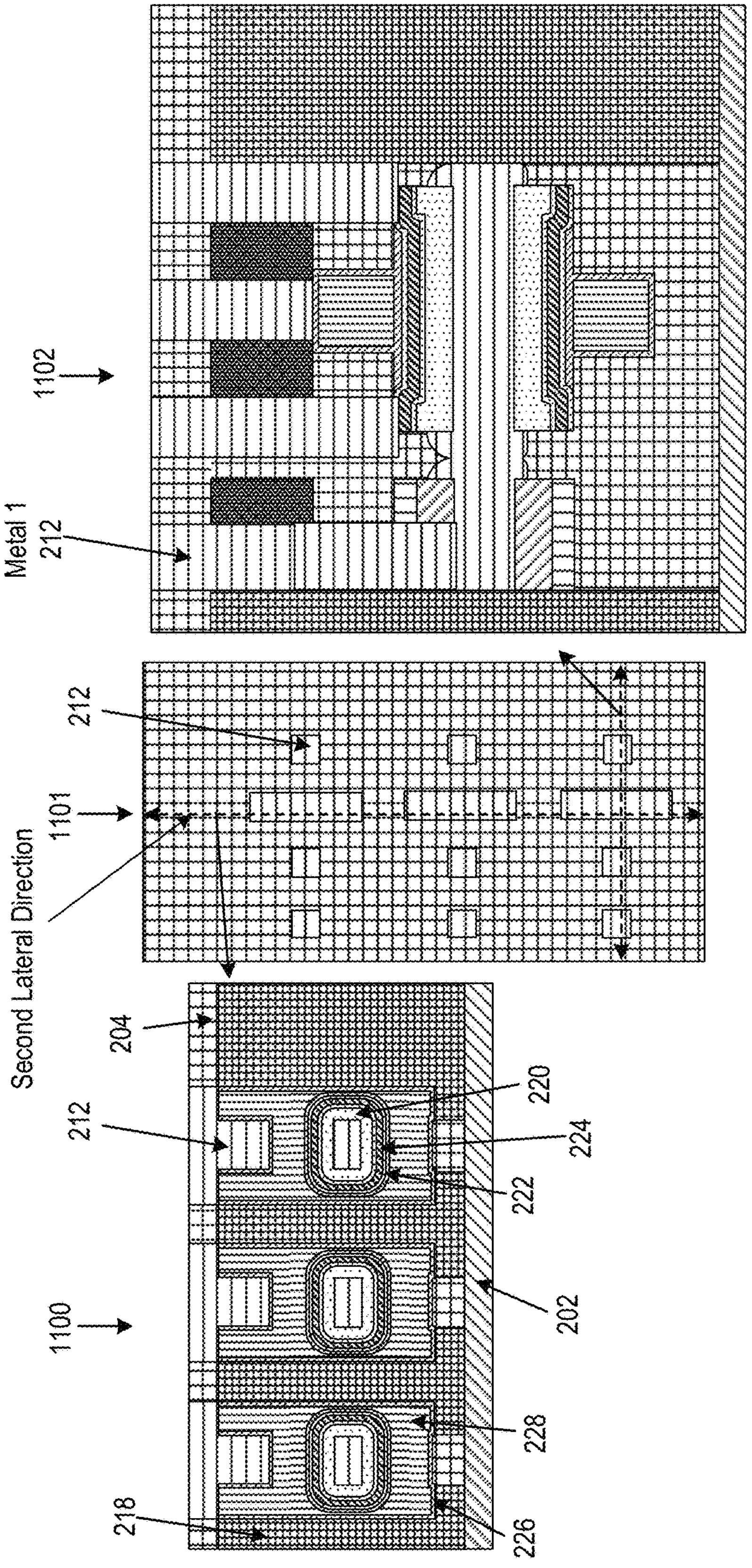

Corresponding to operations 114 and 116 of FIG. 1, FIG. 11 shows a top view 1101 and cross-sectional views 1100, 1102 of the semiconductor device 200 in which metal fills are deposited into the openings or recessed areas. The cross-sectional view 1102 shows the cross-section of the semiconductor device 200 in the first lateral direction (e.g., x-axis). The cross-sectional view 1100 shows the cross-section of the semiconductor device 200 in the second lateral direction (e.g., y-axis). For example, a mask having a predetermined pattern (e.g., PR layer 216) can be formed over the semiconductor device 200. With the mask, at least one of the dielectric layers 208, 210 disposed over the second portion of the metal structure 212 can be etched using at least one suitable technique. By etching the dielectric layers 208, 210, the top surface of the second portion of the metal structure 212 can be exposed via the opening formed from the etching process. Further, a portion of the dielectric layer 222 can be etched using the predefined mask to expose the surface of the conductive oxide structure 224, as shown in conjunction with at least FIG. 11. The mask (or the PR layer 216) can be removed after the etching process.

Then, the metal fill can be deposited to (e.g., electrically) contact with the surfaces (or portions of the surfaces) of the materials, including but not limited to the second portion of the metal structure 212, the conductive oxide structure 224, or the high-k dielectric material 226. The deposited metal fill can be etched using at least one suitable etching technique, such as CMP, to lower the metal fill to just about the surface of the dielectric layer 204, as shown in conjunction with FIG. 11. The metal fill can include or be composed of a similar or different material from the metal structure 212. The metal fill can be deposited to extend vertically and exposed at the surface of the semiconductor device 200.

For example, as shown in FIG. 11, a deposited metal fill can extend in a vertical direction, connecting from the gate structure (e.g., the high-k dielectric material 226) to the surface of the semiconductor device 200. Another deposited metal fill can extend in a vertical direction, connecting from the second portion of the metal structure 212 to the surface of the semiconductor device 200. The metal fill extending in the vertical direction and in connection with the gate structure can correspond to or be referred to as a first gate electrode. The metal fill extending in the vertical direction and in connection with the second portion of the metal structure 212 can correspond to or be referred to as a second gate electrode.

In further examples, the metal fill can extend vertically from different ends of the channel layer (e.g., the conductive oxide structure 224) to the surface of the semiconductor device 200. The different ends can include a first end of the channel layer and a second end of the channel layer. In some implementations, the metal fill extending in the vertical direction and connected to the first end of the channel layer can correspond to a first S/D electrode of the semiconductor device 200. The metal fill extending in the vertical direction and connected to the second end of the channel layer can correspond to a second S/D electrode of the semiconductor device 200. The ends of the channel layer can refer to around the edges of the conductive oxide structure 224 or the dielectric layer 222, where the first end is opposite to the second end in the first lateral direction. Hence, the 3D ferroelectric horizontal nanosheet FET for n-bit memory cell element can be fabricated using the operations described in conjunction with but not limited to FIGS. 2-11, including operations 102-116.

Figure 12:
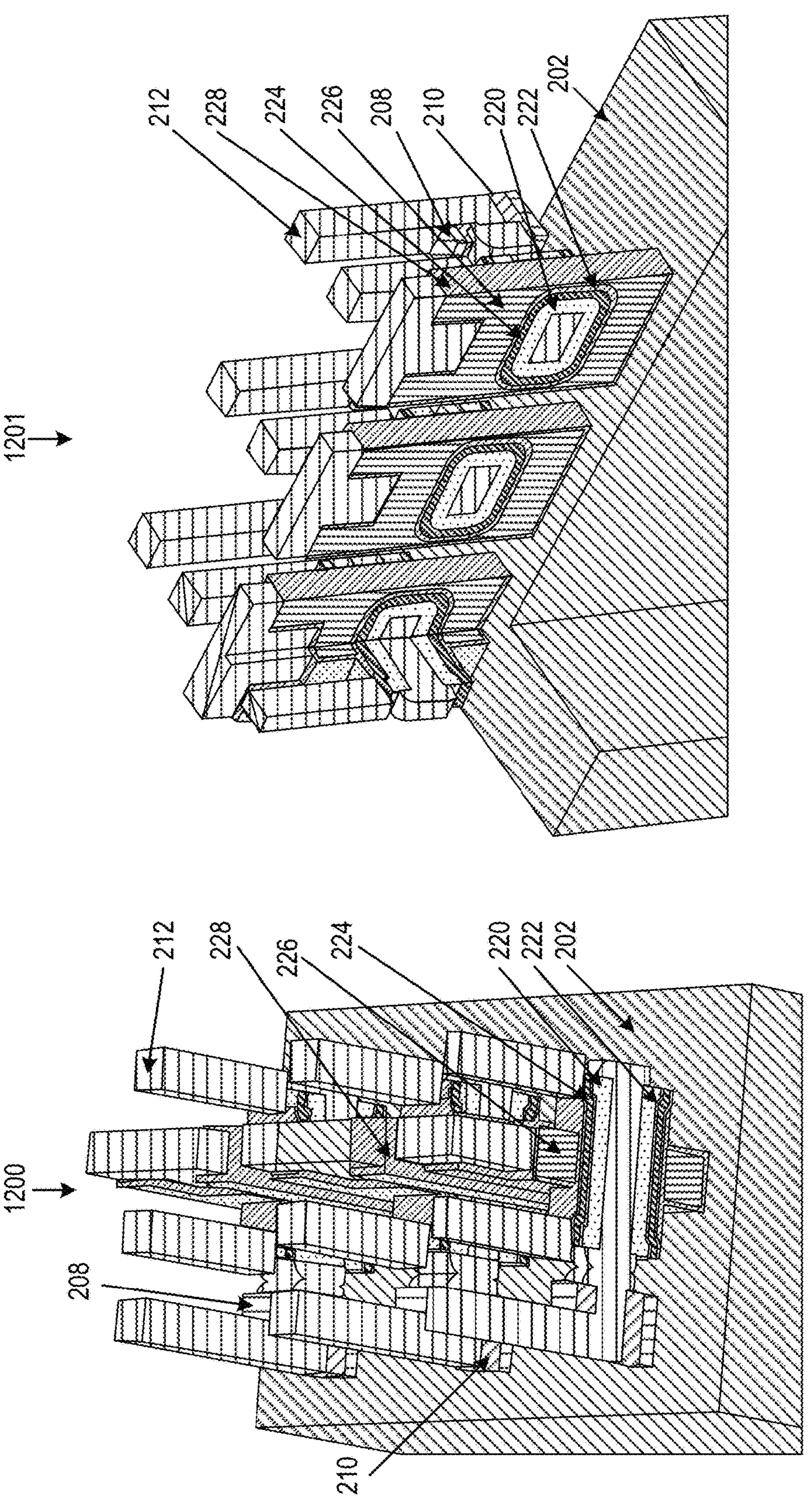

FIG. 12 shows perspective views 1200, 1201 of the semiconductor device 200 fabricated using the operations described in conjunction with FIGS. 2-11. As discussed herein, the operations of method 100 can be performed iteratively or concurrently in multiple parts, for instance, to form multiple sets of structures or electronic components of the semiconductor device 200. These sets of structures can be arranged vertically or horizontally with respect to each other. As shown in FIG. 12, the semiconductor device 200 can include but is not limited to three sets of structures arranged horizontally with respect to each other.

Each set of structures can include its respective set of materials, including but not limited to a respective stack of dielectric materials (or layers) formed over the substrate (e.g., silicon 202), metal structure, channel layer, gate structure, S/D electrodes, gate electrodes, etc. For example, a first set of structures and a second set of structures (among other sets of structures) can be fabricated using at least the operations 102-116 described in conjunction with but not limited to FIGS. 1-11 can be fabricated concurrently or iteratively. The first set of structures can include, but not limited to, at least one of a first metal structure (e.g., metal structure 212) extending in the first lateral direction, a first ferroelectric layer (e.g., ferroelectric layer 220) surrounding a first portion of the first metal structure, a first channel layer (e.g., dielectric layer 222 or conductive oxide structure 224) surrounding the first ferroelectric layer, a first gate structure (e.g., high-k dielectric material 226 and metal structure 228) surrounding the first portion of the first metal structure, with the first ferroelectric layer and the first channel layer interposed therebetween, a first gate electrode (e.g., extending in the vertical direction) in electrical contact with the first gate structure, a second gate electrode in electrical contact with a second portion of the first metal structure, a first source/drain electrode extending in the vertical direction to connect to the first end of the first channel layer, and a second source/drain electrode extending in the vertical direction to connect to the second end of the first channel layer.

In further examples, the second set of structures of the semiconductor device 200 can be fabricated with similar materials or different materials. For instance, the second set of structures can include, but not limited to, at least one of a second metal structure (e.g., metal structure 212) extending in the first lateral direction, a second ferroelectric layer (e.g., ferroelectric layer 220) surrounding a first portion of the second metal structure, a second channel layer (e.g., dielectric layer 222 or conductive oxide structure 224) surrounding the second ferroelectric layer, a second gate structure (e.g., high-k dielectric material 226 and metal structure 228) surrounding the first portion of the second metal structure, with the second ferroelectric layer and the second channel layer interposed therebetween, a third gate electrode (e.g., extending in the vertical direction) in electrical contact with the second gate structure, a fourth gate electrode in electrical contact with a second portion of the second metal structure, a third source/drain electrode extending in the vertical direction to connect to the first end of the second channel layer, and a fourth source/drain electrode extending in the vertical direction to connect to the second end of the second channel layer.

In the above examples, the sets of structures of the semiconductor device 200 may be separated by a predetermined distance, according to the specification. In some implementations, certain materials or structures of different sets of structures of the semiconductor device 200 can be connected or coupled to each other by an interconnecting structure, as discussed herein. In some arrangements, different sets of structures can include additional or fewer materials relative to each other.

Figure 13:
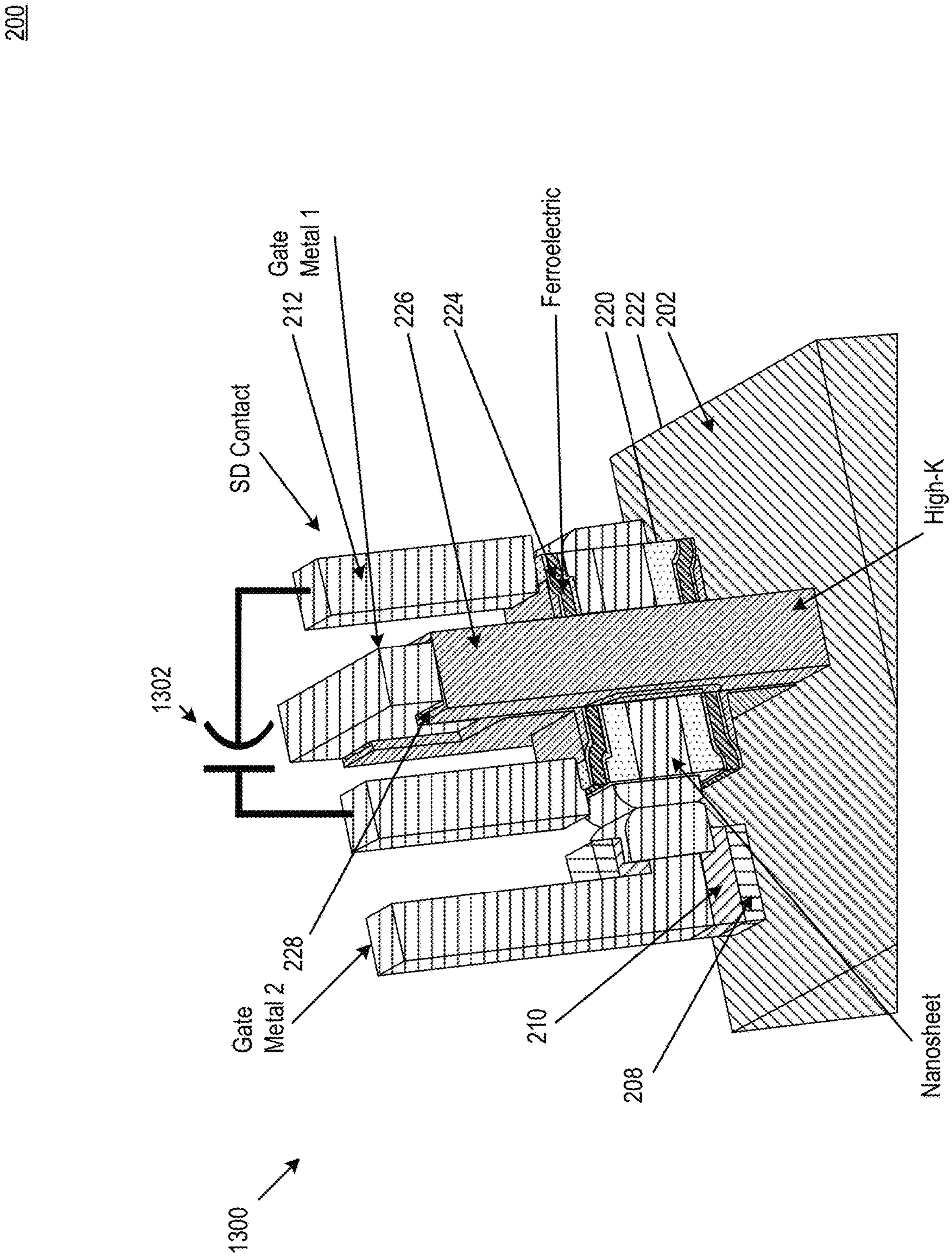

FIG. 13 shows the perspective view 1300 of the semiconductor device 200 with an example capacitance (e.g., shown at 1302) formed from fabricating the S/D electrodes and gate electrodes, using the operations described in conjunction with FIGS. 1-11. As shown, by fabricating the semiconductor device 200 as discussed in conjunction with at least operations 102-116 of FIG. 1, capacitance can form between the S/D electrodes (e.g., sometimes referred to as S/D contacts). The capacitance can be associated with the gate electrode (e.g., the first gate electrode) and the channel layer, e.g., sometimes referred to as gate-source capacitance or gate-drain capacitance. In this case, the gate structure can include or correspond to a pass transistor gate. The structures fabricated using the operations of method 100 can form a semiconductor FET.

In various implementations, the metal structure 212 (e.g., first metal structure), the ferroelectric layer 220, the first channel layer (e.g., including at least one of the dielectric layer 222 or conductive oxide structure 224), and the gate structure (e.g., including the high-k dielectric material 226 and metal structure 228) can operatively serve as a FeFET-based memory cell of the semiconductor device 200. The FeFET-based memory cell can be operated by applying electricity (e.g., voltage) to at least one of the gate electrodes, such as the first gate electrode (e.g., the metal material connected to the gate structure) or the second gate electrode (e.g., the metal material connected to the second portion of the metal structure 212). For example, the memory cell can be configured to present four distinct logic states by/through applying respective voltages on the first gate electrode and the second gate electrode. These logic states and the corresponding voltages applied to the gate electrodes can be shown in an example Table 1, although the logic states and the corresponding voltage application are not limited to those described in conjunction with the example Table 1.

EXAMPLE TABLE 1

| Ferro $V_{GF}$ | Switch $V_{GS}$ | Bit | Channel | |
|---|---|---|---|---|
| 0 | 0 | 00 | 0 | Power Off |
| 1 | 0 | 01 | Medium Current | Permanent |
| 0 | 1 | 10 | Lower Current | Power ON |
| 1 | 1 | 11 | High Current | Temporary |

In the example Table 1, for example, when the ferroelectric (e.g., ferroelectric layer 220) is programmed (e.g., $V_{GF}$ is applied), the channel can change from supplying relatively medium current to relatively high current according to the power at the switch terminal (e.g., $V_{GS}$ applied power). For instance, when $V_{GF}$ is 1 (e.g., ferroelectric is programmed), the channel can provide medium current when $V_{GS}$ is 0 (e.g., no voltage at the second gate electrode) and provide high current when $V_{GS}$ is 1 (e.g., voltage applied at the second gate electrode). In another example, when the switch terminal power is off (e.g., $V_{GS}$=0) and the ferroelectric is programmed, the memory block can hold the charge permanently (e.g., as a non-volatile memory cell). In yet another example, to perform a read or write operation, voltage can be applied at the switch terminal (e.g., $V_{GS}$=1), such that the memory block can temporarily hold the charge (e.g., temporary state). In this case, when the ferroelectric is not programmed, the channel can provide a relatively lower current. When the ferroelectric is programmed, the channel can provide a relatively high current.

In various configurations, the semiconductor device 200 can be fabricated with a vertical capacitor for relatively low power consumption memory block elements. The fabrication process for the semiconductor device 200 with the vertical capacitor can be described, for example, in addition to or continuing from the operations 102-116 of the method 100 or operations described in conjunction with FIGS. 2-13. For example, the operations for fabricating the semiconductor device 200 with the vertical capacitor can include, but are not limited to, operations 118-120 of method 100. Other operations can be performed, as discussed herein, for fabricating the semiconductor device 200 to provide the relatively low power consumption memory block elements.

Figure 14:
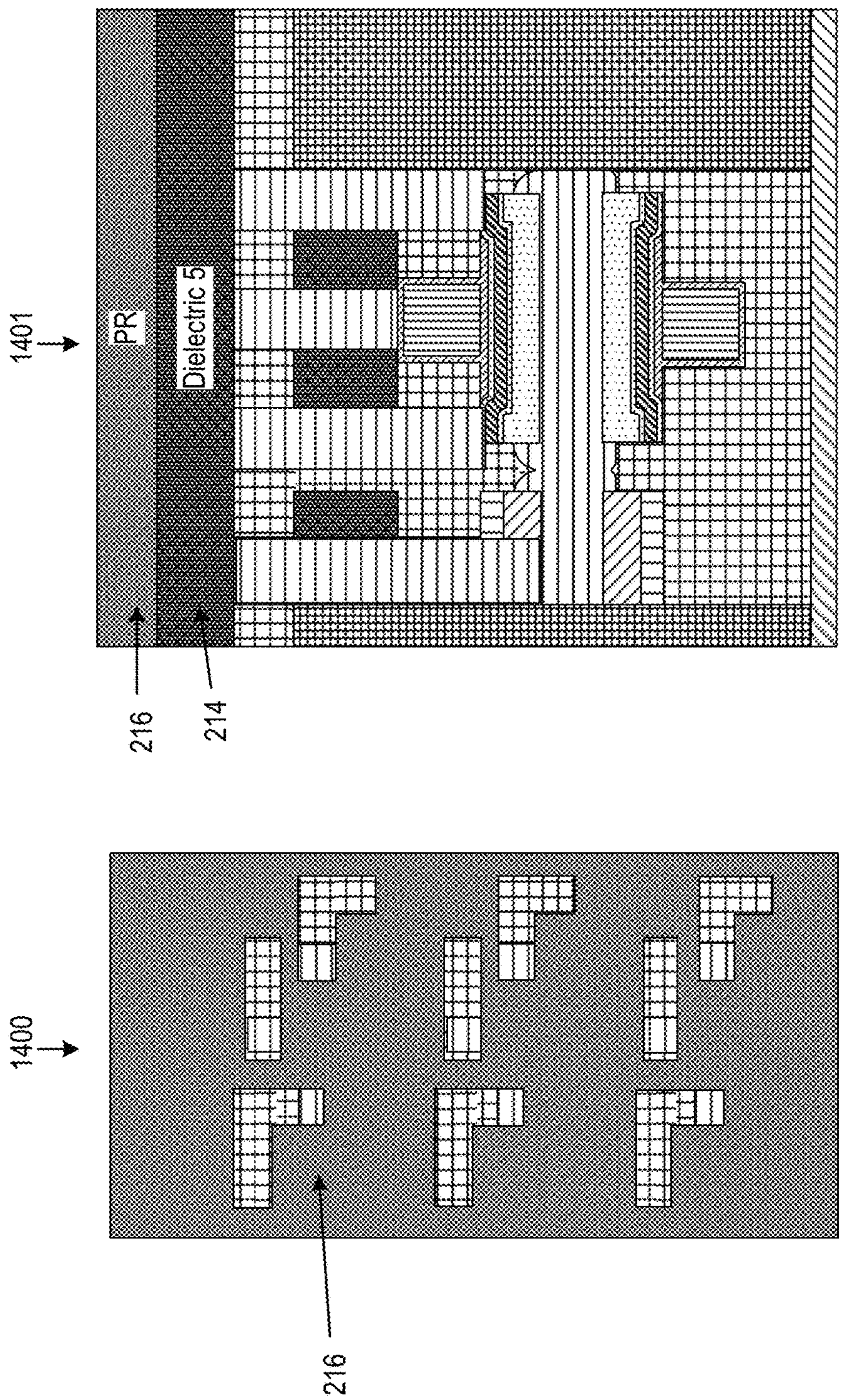
FIGS. 14-21 show various views of a second process flow to manufacture semiconductor devices with vertical capacitor for low power consumption memory block elements, according to an embodiment.

FIG. 14 shows a top view 1400 and a cross-sectional view 1401 of the semiconductor device 200 in which a dielectric material is deposited over the top surface of the semiconductor device 200. Fabricating the vertical capacitor can include extending and redirecting the connection, such that the connections can be reached or accessed from the top of the semiconductor device 200 without cross-connection. As an initial step, the fifth dielectric material can be deposited over the semiconductor device 200 using at least one suitable deposition technique to form the dielectric layer 214. Although the fifth dielectric material is used in this example, other dielectric materials can be used additionally or alternatively.

Then, the PR layer 216 (e.g., mask) having a predefined pattern can be formed over the deposited dielectric layer 214. The pattern of the PR layer 216 can include openings, such as those shown in the top view 1400, for example. Other variations of the patterns may be provided, not limited to the pattern described in conjunction with FIG. 14. The dielectric materials under the PR layer 216 can be etched using at least one suitable etching process to form various openings corresponding to the predefined pattern. In this case, the dielectric layer 216 can be etched to expose at least but not limited to portions of the first dielectric material (e.g., dielectric layer 204) and the top surfaces of the first gate electrode and the first and second S/D electrodes. The PR layer 216 can be removed after performing the etching process.

Figure 15:
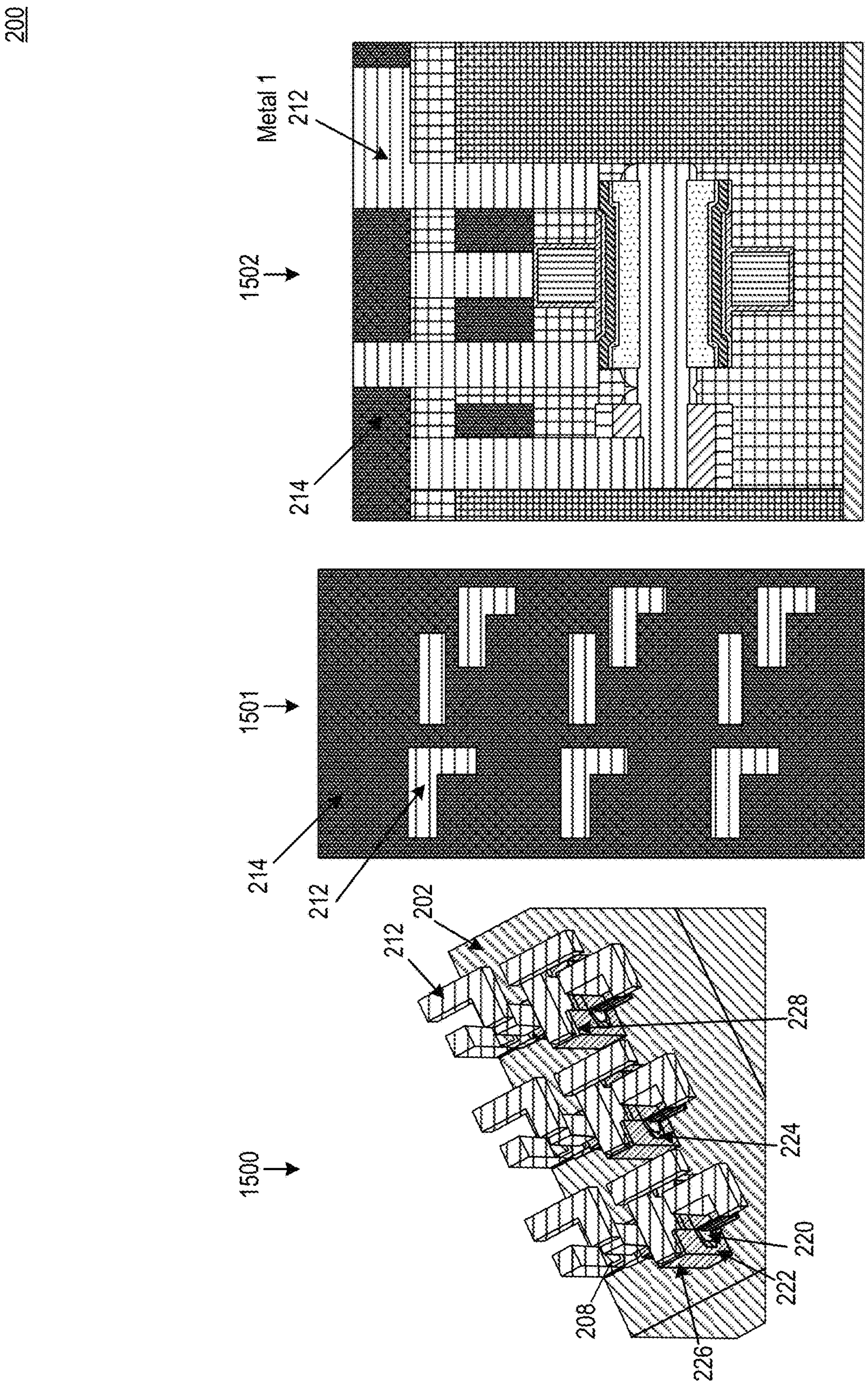

FIG. 15 shows a perspective view 1500, a top view 1501, and a cross-sectional view 1502 of the semiconductor device 200 in which a metal material (e.g., sometimes referred to as a first metal material) is deposited into the formed openings. As shown, the first metal material can be deposited into the openings formed in conjunction with FIG. 14. The first metal material formed can be similar or different from the metal material used to form the metal structure 212. After filling the openings with the first metal material, the first metal material can be etched to lower the first metal material to around the surface of the dielectric layer 214. The top surface of the deposited first metal material can be just below, at, or above the top surface of the dielectric layer 214. To illustrate the connections of the semiconductor device 200, the perspective view 1500 can include or depict the connections without various dielectric materials, such as without the dielectric layers 204, 206, 208, 210, 214, or 218.

Figure 16:
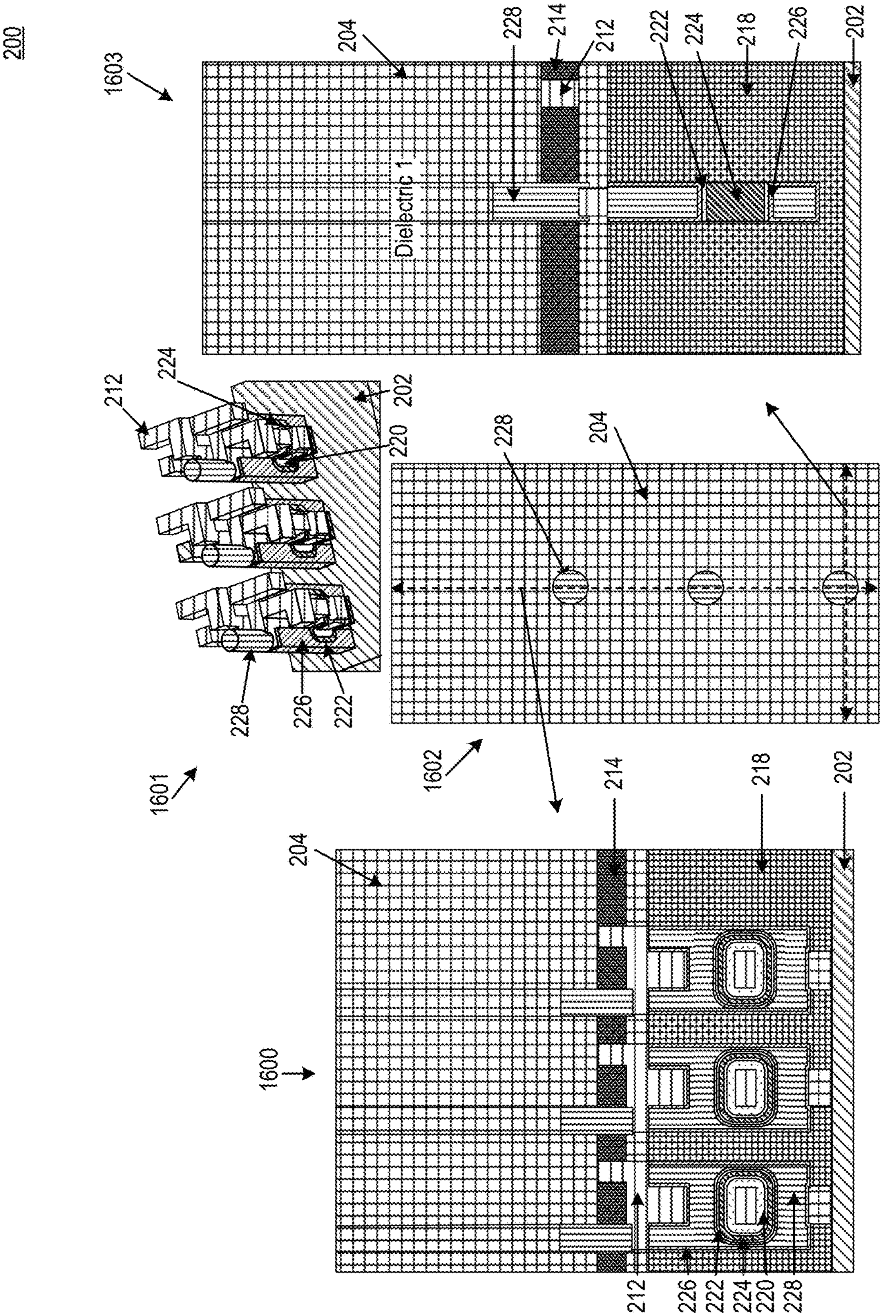

FIG. 16 shows a perspective view 1601, a top view 1602, and cross-sectional views 1600, 1603 of the semiconductor device 200 in which a vertical trench for the vertical capacitor is formed. The perspective view 1601 can show the various connections of the semiconductor device 200 without certain dielectric materials, such as dielectric layers 204, 206, 208, 210, 214, or 218. The cross-sectional view 1603 can illustrate a side cross-section of the semiconductor device 200 extending in the first lateral direction. The cross-sectional view 1600 can illustrate a side cross-section of the semiconductor device 200 extending in the second lateral direction.

In some implementations, the cross-sectional view 1603 can illustrate the side cross-section of the conductive oxide structure 224 wherein a portion of the first gate electrode and one of the S/D electrodes (e.g., the right S/D electrode) are presented. As shown, a dielectric material, such as but not limited to the first dielectric material, can be deposited using at least one suitable deposition technique over the semiconductor device 200 up to a predetermined thickness. The deposited first dielectric material may form another (e.g., top-most) dielectric layer 204. A mask having a predefined pattern can be formed over the semiconductor device 200 (e.g., the dielectric layer 204 in this case).

Subsequently, the top-most dielectric layer 204, among other dielectric materials, can be etched using the mask. For example, using the mask, the dielectric layer 204 and a portion of the dielectric layer 214 can be etched to form openings expositing the surface of the metal materials (e.g., the (first) gate electrodes associated with respective sets of structures). In this case, the etching process can stop at or on the metal material of the first gate electrode for a pass transistor. Although FIG. 16 shows three sets of structures, such as including first, second, and third gate structures, more or fewer sets of structures can be implemented not limited to the number of sets of structures discussed herein. Then, a metal material (e.g., sometimes referred to as a second metal material) can be deposited in the openings, extending in the vertical direction to contact with the first gate electrode. The second metal material can be similar to or different from the metal material used to form the metal structure 228. In some cases, the second metal material may be referred to as the metal structure 228, in contact with the top surface of the first gate electrode. The second metal material can be an extension of the first gate electrode. In various embodiments, the second metal material can be etched down to a predetermined height.

Figure 17:
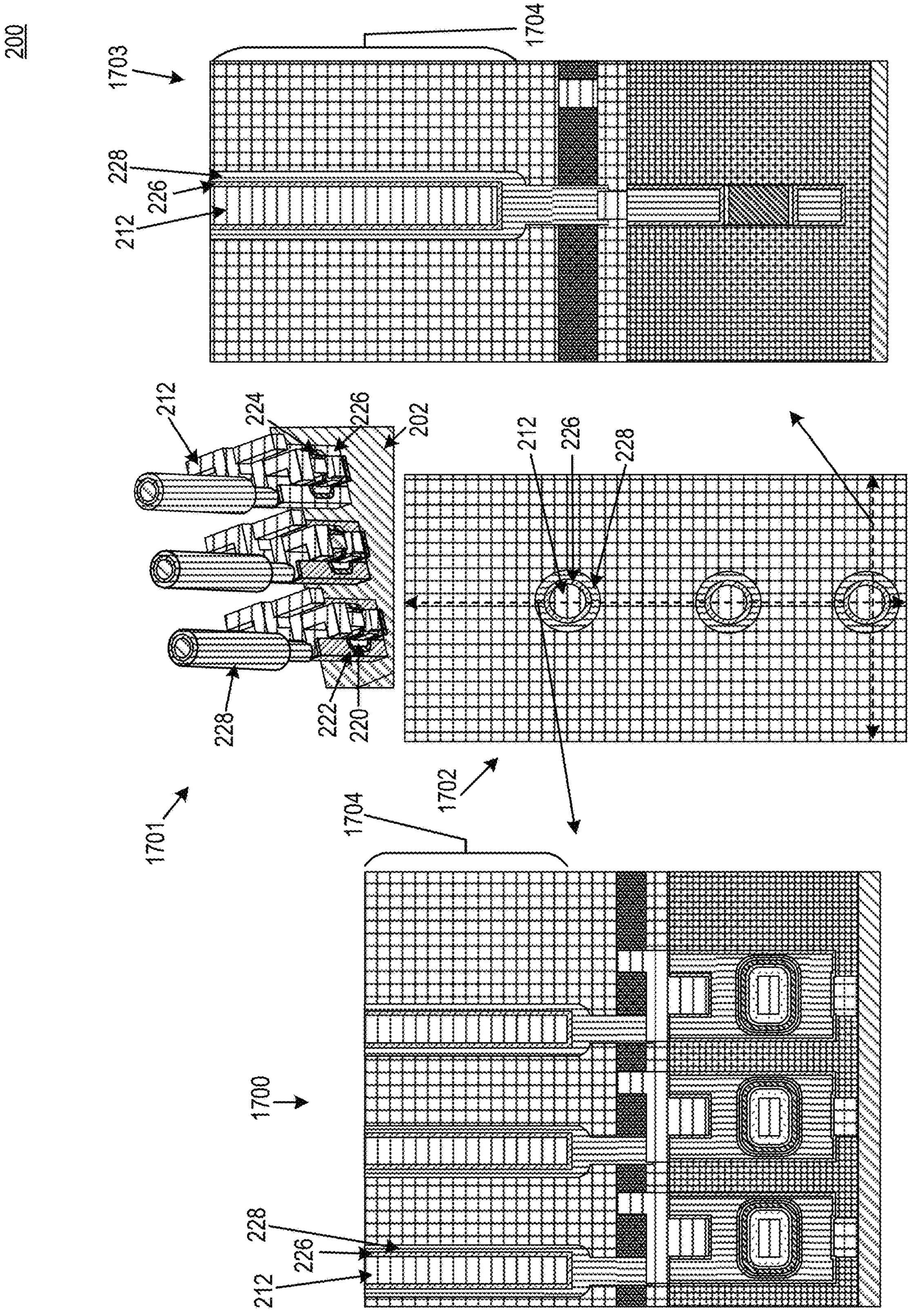

Corresponding to operation 118 of FIG. 1, FIG. 17 shows a perspective view 1701, a top view 1702, and cross-sectional views 1700, 1703 of the semiconductor device 200 in which a capacitor trench area (e.g., portion 1704 shown in the cross-sectional views 1700, 1703) to form a vertical capacitor is formed. The perspective view 1701 can show the various connections of the semiconductor device 200 without certain dielectric materials, such as dielectric layers 204, 206, 208, 210, 214, or 218. The cross-sectional view 1703 can illustrate a side cross-section of the semiconductor device 200 extending in the first lateral direction. The cross-sectional view 1700 can illustrate a side cross-section of the semiconductor device 200 extending in the second lateral direction.

A mask with a predefined pattern can be formed over the semiconductor device 200. The pattern of the mask can include various openings positioned at the openings of the trench area. The openings of the mask can include a relatively wider or greater dimension compared to the formed openings of the trench area. With the mask, the dielectric layer 204 can be etched using at least one suitable etching technique. The dielectric layer 204 can be etched down to the surface or a portion of the second metal material (e.g., labeled as the metal structure 228) formed in the openings (e.g., previous narrower openings). By etching the dielectric layer 204 with the predefined pattern, the trench area for forming the vertical capacitor can be widened (or enlarged).

Then, a metal material (e.g., the second metal material) can be deposited into the (e.g., widened) openings using at least one suitable deposition technique. The relatively wider second metal material can be in contact with or a part of the relatively narrower second metal material described in conjunction with at least FIG. 16. The second metal material (e.g., excess material of the second metal material) can be etched, such as down to the surface of the dielectric layer 204.

Another mask having a predefined pattern can be formed over the semiconductor device 200. The mask can be used to etch a portion (e.g., inner portion) of the second metal material to form a relatively narrower opening for the trench area. For example, using the mask, the second metal material can be etched down to a predetermined distance. Then, a high-k dielectric material, such as but not limited to the high-k dielectric material 226, can be deposited into the formed openings. The high-k dielectric material 226 can be formed with a predefined thickness. In some cases, the high-k dielectric material 226 may be etched using at least one suitable etching technique to form another opening within the trench area. In some other cases, the high-k dielectric material 226 can be formed on the inner side of the second metal material, thereby forming another (e.g., relatively narrower) opening. In the remaining openings, a metal material (e.g., sometimes referred to as a third metal material) can be deposited into the opening. The third metal material can be similar to or different from the metal material used to form the metal structure 212. The third metal material can be different from the second metal material. By depositing the third metal material, the high-k dielectric material 226 can be interposed between the second metal material and the third metal material.

In some implementations, the third metal material can correspond to the vertical capacitor. For example, in the trench area, the third metal material can be deposited to form a vertical capacitor in association with a respective set of structures. For the first set of structures, a first vertical capacitor can be formed in electrical contact with the first gate structure. For the second set of structures, a second vertical capacitor can be formed in electrical contact with the second gate structure. Other vertical capacitors can be formed for other sets of structures to be in electrical contact with the respective gate structures.

Figure 18:
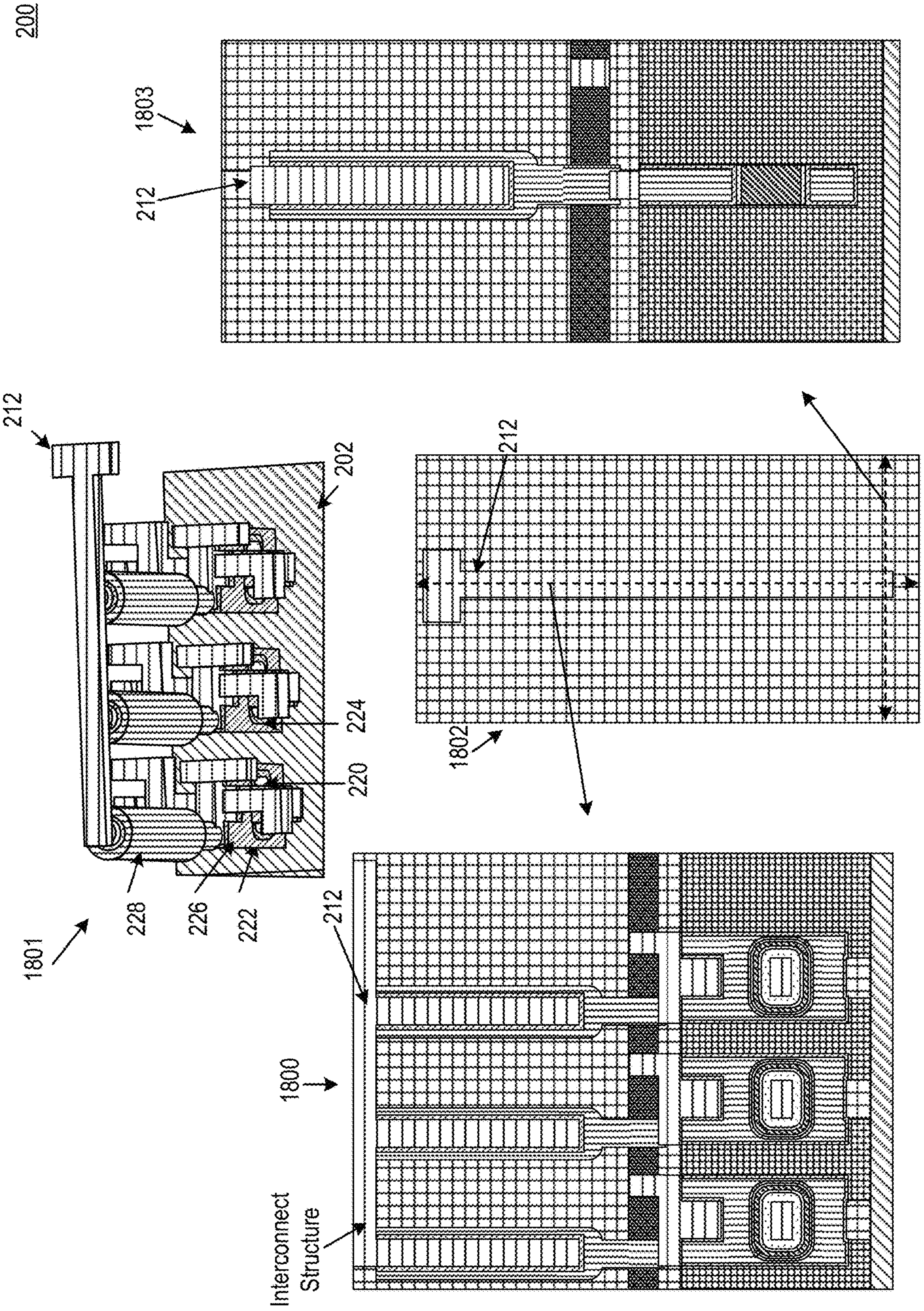

Corresponding to operation 120 of FIG. 1, FIG. 18 shows a perspective view 1801, a top view 1802, and cross-sectional views 1800, 1803 of the semiconductor device 200 in which an interconnect structure (e.g., a connection of the common ground for the vertical capacitor) is formed. The perspective view 1801 can show the various connections of the semiconductor device 200 without certain dielectric materials, such as dielectric layers 204, 206, 208, 210, 214, or 218. The cross-sectional view 1803 can illustrate a side cross-section of the semiconductor device 200 extending in the first lateral direction. The cross-sectional view 1800 can illustrate a side cross-section of the semiconductor device 200 extending in the second lateral direction.

For example, to connect the common ground of the vertical capacitor, the dielectric layer 204, the second and third metal materials, and the high-k dielectric material 226 of the trench area can be etched using at least one suitable etching technique to reduce the height. In some cases, a mask having a predefined pattern can be formed over the semiconductor device 200. Using the mask, the second metal material and the high-k dielectric material 226 can be etched lower, while maintaining the height of the dielectric layer 204 and the third metal material, for example. After etching the second metal material and the high-k dielectric material 226, the dielectric material, such as the first dielectric material, can be deposited over the semiconductor device 200 using at least one suitable deposition technique.

Then, a mask having a predefined pattern can be formed over the semiconductor device 200, e.g., a common ground mask. An etching process can be performed using at least one suitable etching technique to remove a portion of the dielectric layer 204 (e.g., the deposited first dielectric material), creating a recess that exposes the top surface of the third metal material. The metal material (e.g., the third metal material) can be deposited to fill the recess, extending in the second lateral direction, such as shown in at least the cross-sectional view 1800 and the top view 1802. An etching process can be performed after depositing the second metal material, such as CMP to remove excess material.

In various implementations, the deposited third metal structure can correspond to or be referred to as the interconnect structure extending the second lateral direction. The interconnect structure can (e.g., electrically) contact with one or more vertical capacitors, such as the first vertical capacitor, the second vertical capacitor, and a third vertical capacitor. The interconnect structure can connect the different vertical capacitors associated with their respective gate structures. Although three vertical capacitors are shown, more or fewer vertical capacitors can be implemented for the semiconductor device 200.

Figure 19:
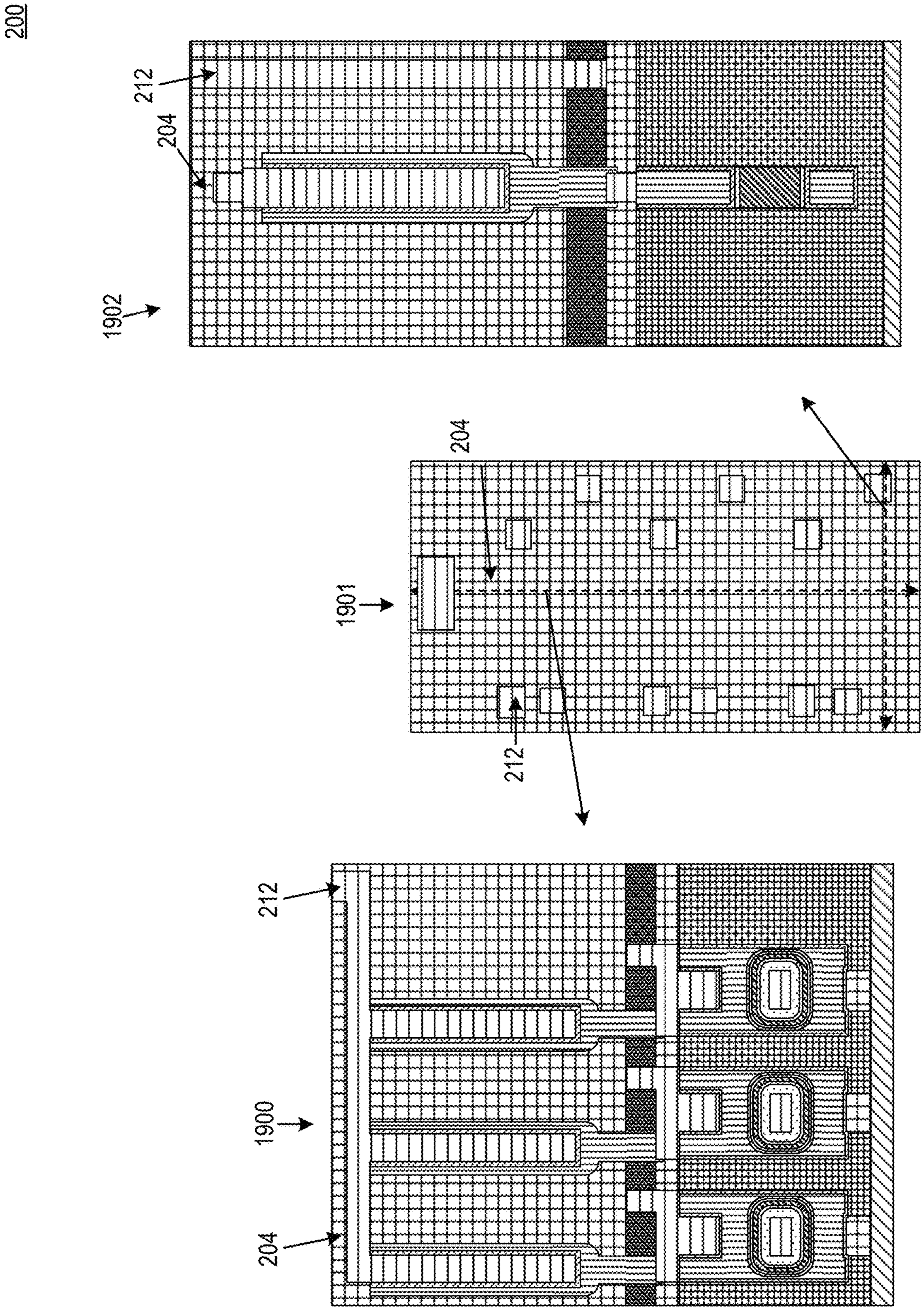

FIG. 19 shows a top view 1901 and cross-sectional views 1900, 1902 of the semiconductor device 200 in which the interconnect structure (e.g., associated with the gate electrodes), other gate electrodes, and S/D electrodes are extended in the vertical direction. As shown, a dielectric material, such as the first dielectric material used to form the dielectric layer 204, can be deposited over the semiconductor device 200 using at least one suitable deposition technique. The first dielectric material can be deposited to a predefined thickness.

A mask having a predefined pattern (e.g., PR layer 216) can be formed over the semiconductor device 200. The mask can be referred to as a top connection mask. The pattern (e.g., opening of the mask) can be aligned with various the individual metal pads/contacts, such as at least one of but not limited to the second gate electrode of the first metal structure, the fourth gate electrode of the second metal structure, a sixth gate electrode of a third gate electrode, the S/D electrodes, or the interconnect structure, such as shown in the example top view 1901.

With the top connection mask, an etching process can be performed to directionally etch the top dielectric layer 204 down to about the surface of the metal materials, such as exposing the top surface of the interconnect structure, the S/D electrodes, or the gate electrodes, among other structures or materials. The PR layer 216 can be removed after the etching process. The openings formed by the etching process can be filled through a deposition of a metal material, such as the third metal material used to form the interconnect structure, the vertical capacitors, or the S/D electrodes, for example. As shown in FIG. 19, the deposited metal material can be extended in the vertical direction and exposed on the top surface of the semiconductor device 200. An etching process can be performed, such as CMP to remove excess material.

Figure 20:
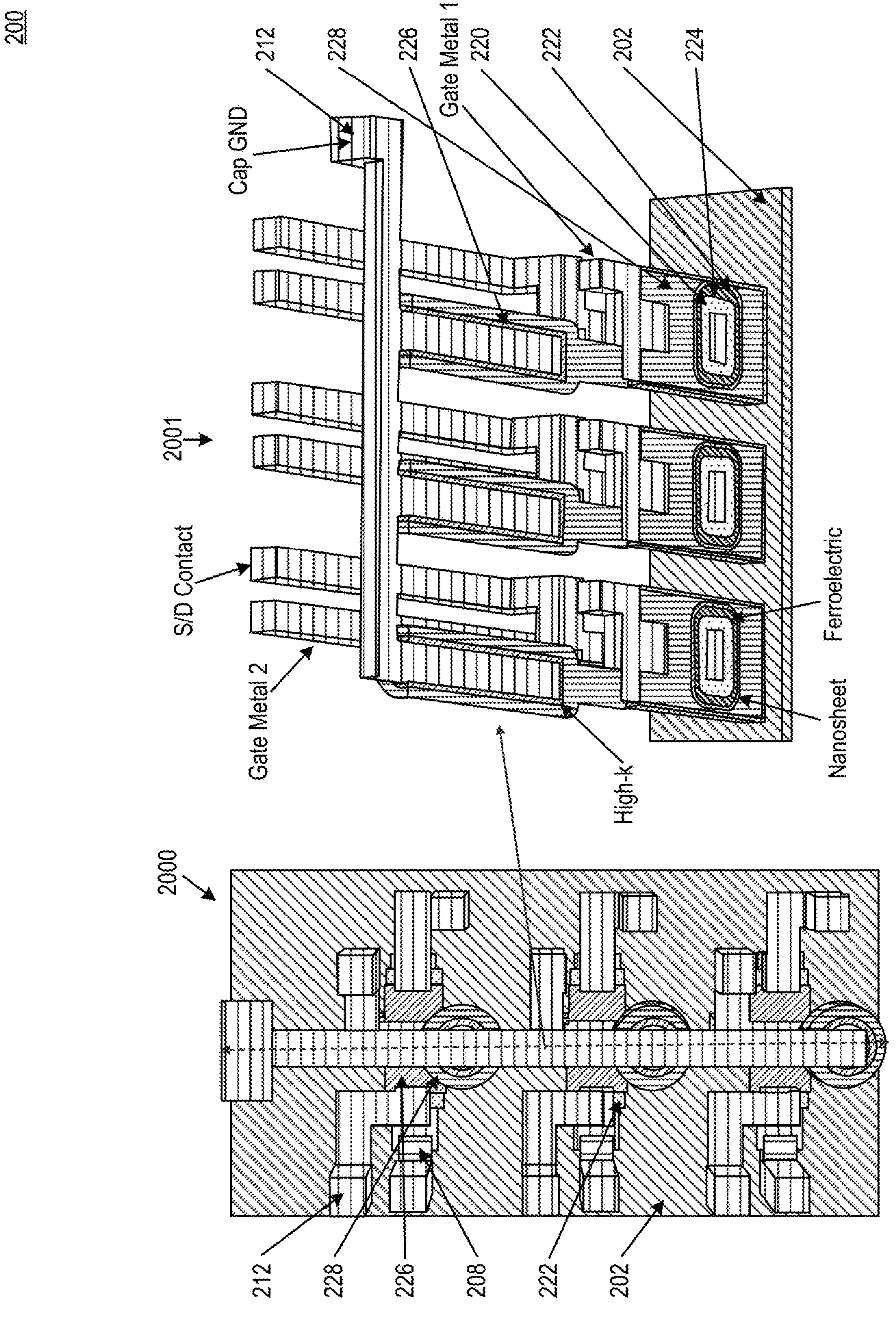
Figure 21:
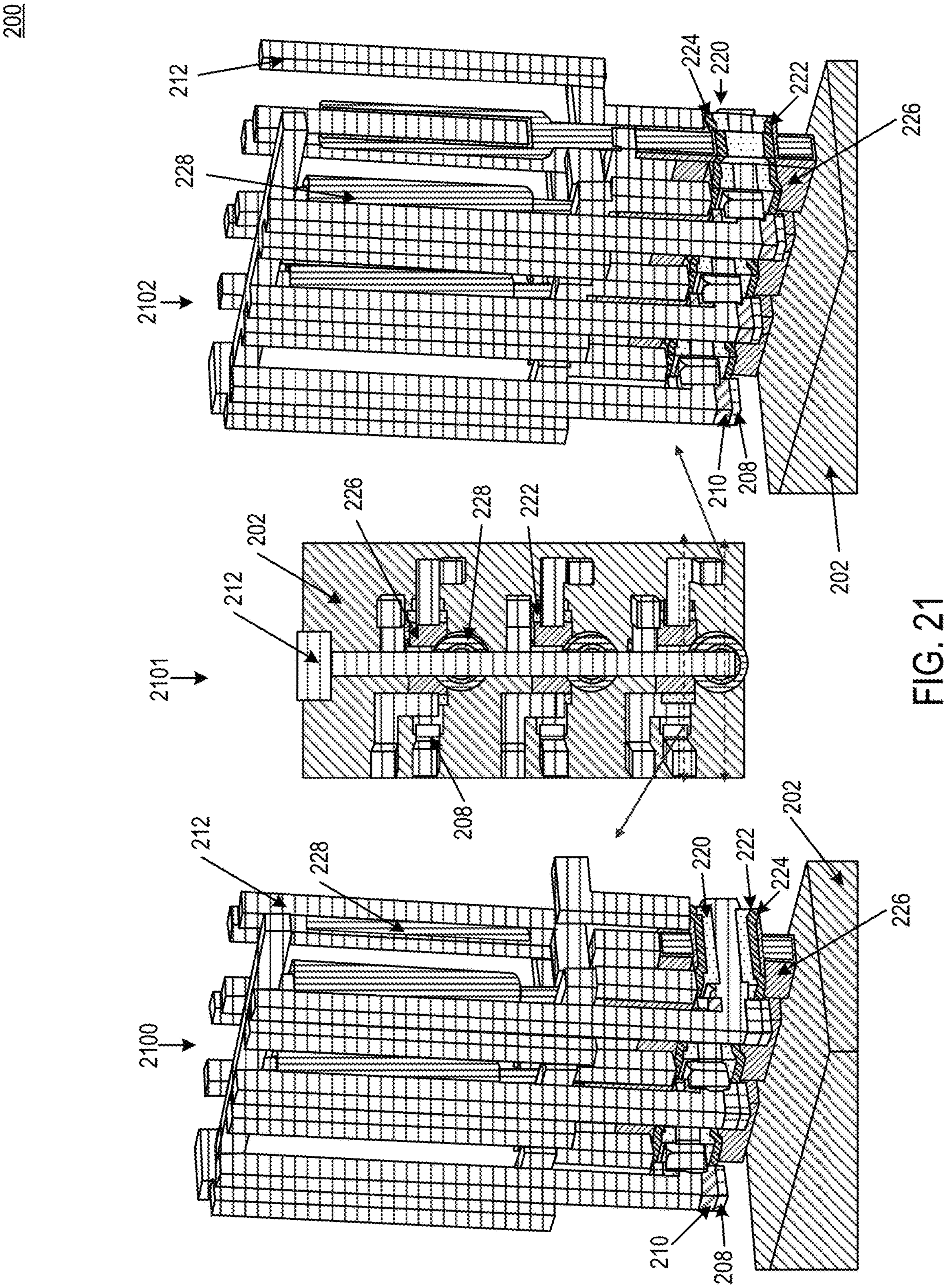

FIGS. 20-21 show various 3-dimensional (3D) views including 3D top views 2000, 2101 and 3D perspective views 2001, 2100, 2102 of the semiconductor device 200 fabricated using the operations discussed in conjunction with at least but not limited to FIGS. 1-19. The operations of the fabricated semiconductor device 200 with the vertical capacitor, such as the semiconductor device 200 shown in at least FIGS. 20-21, can include or present four distinct logic states, such as but not limited to zero current (e.g., no current state), medium current, lower current, or high current state. For example, the metal structure 212 (e.g., first metal structure), the ferroelectric layer 220, the first channel layer (e.g., including at least one of the dielectric layer 222 or conductive oxide structure 224), and the gate structure (e.g., including the high-k dielectric material 226 and metal structure 228) can operatively serve as a FeFET-based memory cell of the semiconductor device 200. The FeFET-based memory cell can be operated by applying electricity (e.g., voltage) to at least one of the gate electrodes, such as the first gate electrode (e.g., the metal material connected to the gate structure) or the second gate electrode (e.g., the metal material connected to the second portion of the metal structure 212). For example, the memory cell (e.g., sometimes referred to as memory block element) can be configured to present four distinct logic (or current) states by/through applying respective voltages on the first gate electrode and the second gate electrode. These logic states and the corresponding voltages applied to the gate electrodes of the semiconductor device 200 with the vertical capacitors can be shown in but are not limited to an example Table 2.

EXAMPLE TABLE 2

| Ferro $V_{GF}$ | Switch $V_{GS}$ | Bit | Channel | |
|---|---|---|---|---|
| 0 | 0 | 00 | 0 | Power Off |
| 1 | 0 | 01 | Medium Current | Permanent |
| 0 | 1 | 10 | Lower Current | Power ON |
| 1 | 1 | 11 | High Current | Permanent |

Certain features of the example Table 2 may be similar to the features of the example Table 1. For instance, when the ferroelectric (e.g., ferroelectric layer 220) is programmed (e.g., $V_{GF}$ is applied), the channel can change from supplying relatively medium current to relatively high current according to the power at the switch terminal (e.g., Vas applied power). As shown in the example Table 2, when $V_{GF}$ is 1 (e.g., ferroelectric is programmed), the channel can provide relatively medium current when $V_{GS}$ is 0 (e.g., no voltage at the second gate electrode) and provide relatively high current when $V_{GS}$ is 1 (e.g., voltage applied at the second gate electrode). In another example, when $V_{GF}$ is 0 (e.g., the ferroelectric is not programmed), the channel can provide zero current when $V_{GS}$ is 0 and provide relatively lower current when $V_{GS}$ is 1. By implementing the vertical capacitors with the interconnect structure, connecting the vertical capacitors to the same ground as shown in at least FIGS. 19-21, the memory block (e.g., the FeFET-based memory cell) can hold the charge permanently when the ferroelectric is programmed for when the switch terminal power is off and on. For instance, the vertical capacitors can supply charges to the memory block, thereby maintaining the charge in a permanent state. In this case, the time to refresh the capacitor can be minimized, reducing the power consumption of the semiconductor device 200.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A semiconductor device, comprising:

a first metal structure extending in a first lateral direction;

a first ferroelectric layer surrounding a first portion of the first metal structure;

a first channel layer surrounding the first ferroelectric layer;

a first gate structure surrounding the first portion of the first metal structure, with the first ferroelectric layer and the first channel layer interposed therebetween;

a first gate electrode in electrical contact with the first gate structure; and a second gate electrode in electrical contact with a second portion of the first metal structure.

2. The semiconductor device of claim 1, wherein the second portion of the first metal structure is extended from the first portion of the first metal structure along the first lateral direction.

3. The semiconductor device of claim 1, wherein the first gate electrode and the second gate electrode both extend in a vertical direction, and are electrically isolated from each other.

4. The semiconductor device of claim 1, further comprising:

a second metal structure extending in the first lateral direction and spaced from the first metal structure in a second lateral direction perpendicular to the first lateral direction;

a second ferroelectric layer surrounding a first portion of the second metal structure;

a second channel layer surrounding the second ferroelectric layer;

a second gate structure surrounding the first portion of the second metal structure, with the second ferroelectric layer and the second channel layer interposed therebetween;

a third gate electrode in electrical contact with the second gate structure; and a fourth gate electrode in electrical contact with a second portion of the second metal structure;

wherein the second portion of the second metal structure is extended from the first portion of the second metal structure along the first lateral direction.

5. The semiconductor device of claim 4, wherein the first gate structure and the second gate structure are electrically coupled to each other.

6. The semiconductor device of claim 5, further comprising:

a first vertical capacitor in electrical contact with the first gate structure;

a second vertical capacitor in electrical contact with the second gate structure; and an interconnect structure extending in the second lateral direction to connect the first vertical capacitor to the second vertical capacitor.

7. The semiconductor device of claim 1, further comprising:

a first source/drain electrode extending in a vertical direction to connect to a first end of the first channel layer; and a second source/drain electrode extending in the vertical direction to connect to a second end of the first channel layer.

8. The semiconductor device of claim 1, wherein at least the first metal structure, the first ferroelectric layer, the first channel layer, and the first gate structure operatively serve as a ferroelectric field-effect-transistor (FeFET)-based memory cell.

9. The semiconductor device of claim 8, wherein the memory cell is configured to present four distinct logic states through applying respective voltages on the first gate electrode and the second gate electrode.

10. The semiconductor device of claim 1, wherein the first gate structure includes a high-k dielectric material and a metal material.

11. A semiconductor device, comprising:

a first metal structure extending in a first lateral direction, and including a first portion and a second portion connected to each other with a third portion;

a first ferroelectric layer surrounding the first portion of the first metal structure;

a first channel layer surrounding the first ferroelectric layer;

a first gate structure extending in a second lateral direction perpendicular to the first lateral direction, and surrounding the first portion of the first metal structure with the first ferroelectric layer and the first channel layer interposed therebetween;

a first gate electrode in electrical contact with the first gate structure; and a second gate electrode in electrical contact with the second portion of the first metal structure.

12. The semiconductor device of claim 11, further comprising:

a second metal structure extending in the first lateral direction, and including a first portion and a second portion connected to each other with a third portion;

a second ferroelectric layer surrounding the first portion of the second metal structure;

a second channel layer surrounding the second ferroelectric layer;

a second gate structure extending in the second lateral direction, and surrounding the first portion of the second metal structure with the second ferroelectric layer and the second channel layer interposed therebetween;

a third gate electrode in electrical contact with the second gate structure; and a fourth gate electrode in electrical contact with the second portion of the second metal structure.

13. The semiconductor device of claim 12, wherein the first gate structure and the second gate structure are electrically coupled to each other.

14. The semiconductor device of claim 12, wherein the first channel layer and the second channel layer each include a semiconductive-behaving material.

15. The semiconductor device of claim 11, wherein the first gate electrode and the second gate electrode both extend in a vertical direction and are electrically isolated from each other.

16. The semiconductor device of claim 11, wherein at least the first metal structure, the first ferroelectric layer, the first channel layer, and the first gate structure operatively serve as a ferroelectric field-effect-transistor (FeFET)-based memory cell.

17. The semiconductor device of claim 16, wherein the memory cell is configured to present four distinct logic states through applying respective voltages on the first gate electrode and the second gate electrode.

18. A method for fabricating semiconductor devices, comprising:

providing a stack including a metal structure extending in a first lateral direction;

separating the metal structure into a first portion and a second portion;

connecting the first portion and the second portion with a third portion;

sequentially surrounding the first portion with a ferroelectric layer, a semiconductive-behaving layer, and a gate structure that extends in a second lateral direction; and forming a first gate electrode and a second gate electrode to contact the first portion and the second portion, respectively.

19. The method of claim 18, wherein the first gate electrode and the second gate electrode both extend in a vertical direction and are electrically isolated from each other.

20. The method of claim 18, further comprising:

forming a first source/drain electrode extending in a vertical direction to connect to a first end of the semiconductive-behaving layer; and forming a second source/drain electrode extending in the vertical direction to connect to a second end of the semiconductive-behaving layer.

* * * * *